(12) United States Patent
Itagaki et al.

(10) Patent No.: US 9,894,293 B2
(45) Date of Patent: *Feb. 13, 2018

(54) SEMICONDUCTOR DEVICE, METHOD OF MANUFACTURING SAME, AND METHOD OF CONTROLLING SEMICONDUCTOR DEVICE

(71) Applicant: RENESAS ELECTRONICS CORPORATION, Tokyo (JP)

(72) Inventors: Keiichi Itagaki, Tokyo (JP); Tatsuya Kunikiyo, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/399,878

(22) Filed: Jan. 6, 2017

(65) Prior Publication Data

US 2017/0118419 A1 Apr. 27, 2017

Related U.S. Application Data

(63) Continuation of application No. 14/634,542, filed on Feb. 27, 2015.

(30) Foreign Application Priority Data

Feb. 27, 2014 (JP) ................................. 2014-036886

(51) Int. Cl.
H04N 5/341 (2011.01)
H04N 5/225 (2006.01)
H01L 27/146 (2006.01)

(52) U.S. Cl.
CPC ......... *H04N 5/341* (2013.01); *H01L 27/1461* (2013.01); *H01L 27/1463* (2013.01);
(Continued)

(58) Field of Classification Search
CPC .... H04N 9/045; H04N 5/232; H01L 27/1463; H04L 27/14645; H04L 27/14689
See application file for complete search history.

(56) References Cited

U.S. PATENT DOCUMENTS 7,605,415 B2 10/2009 Koizumi et al.
7,928,478 B2 4/2011 Hynecek
(Continued)

FOREIGN PATENT DOCUMENTS

JP 04-072664 A 3/1992
JP H07-038136 A 2/1995
(Continued)

OTHER PUBLICATIONS

Non-Final Office Action U.S. Appl. No. 14/634,542 dated Jun. 20, 2016.
(Continued)

*Primary Examiner* — Twyler Haskins
*Assistant Examiner* — Fayez Bhuiyan
(74) *Attorney, Agent, or Firm* — McDermott Will & Emery LLP

(57) ABSTRACT

Provided are a semiconductor device capable of detecting a light of each color with high accuracy without using a color filter, particularly enhancing detection accuracy of charges obtained by photoelectric conversion of a long-wavelength light, and manufacturing and control methods thereof. The semiconductor device has a p type semiconductor substrate, and first, second and third pixel regions. These regions each include a p type well region in the p type semiconductor substrate and an n type region configuring a pn junction therewith. The p type well region of the first pixel region is thinner, from the main surface to the lowermost portion, than that of the second and third pixel regions. On the side opposite to the main surface of the p type well region of the first and second pixel regions, a buried p type well region contiguous to the p type well region is further placed.

9 Claims, 34 Drawing Sheets

(52) U.S. Cl.
CPC .. *H01L 27/14645* (2013.01); *H01L 27/14689* (2013.01); *H04N 5/2254* (2013.01)

(56) References Cited

U.S. PATENT DOCUMENTS

| | | |
|---|---|---|
| 8,089,109 B2 | 1/2012 | Shinomiya |
| 8,390,707 B2 | 3/2013 | Yamashita |
| 2013/0215287 A1 | 8/2013 | Kobayashi et al. |

FOREIGN PATENT DOCUMENTS

| | | |
|---|---|---|
| JP | 2004-221506 A | 8/2004 |
| JP | 2006-024907 A | 1/2006 |
| JP | 2007-183218 A | 7/2007 |
| JP | 2008-098601 A | 4/2008 |
| JP | 2008-283057 A | 11/2008 |
| JP | 2008-283058 A | 11/2008 |
| JP | 2009-005061 A | 1/2009 |
| JP | 2013-030803 A | 2/2013 |
| WO | 2008/010292 A1 | 1/2008 |
| WO | 2011/067879 A1 | 6/2011 |

OTHER PUBLICATIONS

Notice of Allowance U.S. Appl. No. 14/634,542 dated Oct. 7, 2016.
Office Action issued in corresponding Japanese Patent Application No. 2014-036886, dated Jun. 27, 2017.

FIG. 3

| N | M | N | M |
|---|---|---|---|
| M | L | M | L |
| N | M | N | M |
| M | L | M | L |

SEMICONDUCTOR DEVICE, METHOD OF MANUFACTURING SAME, AND METHOD OF CONTROLLING SEMICONDUCTOR DEVICE

CROSS-REFERENCE TO RELAYED APPLICATIONS

This Application is a Continuation Application of U.S. Ser. No. 14/634,542, filed on Feb. 27, 2015, now U.S. Pat. No. 9,578,263, which claims priority to Japanese Patent Application No. 2014-036886 filed on Feb. 27, 2014. The subject matter of each is incorporated herein by reference in entirety.

BACKGROUND

The present invention relates to a semiconductor device, a method of manufacturing the same, and a method of controlling a semiconductor device, in particular, a semiconductor device including a photoelectric conversion element such as photodiode, a method of manufacturing the semiconductor device, and a method of controlling the semiconductor device.

An image sensor used for in-car digital cameras particularly digital single-lens reflex cameras is typically manufactured by forming wirings, applying glass coating to the wirings, and then forming a color-separation color filter and a light-collecting on-chip lens on the glass coating. A reflected light from a photographing object passes through color filters of respective colors, depending on the color of the photographing object and this light travels in a photoelectric conversion element. The light is then converted into charges by photoelectric conversion. By analyzing the amount of these charges, the color of the photographing object is detected.

A color filter is made of an organic material rich in metal so that the color filter cannot be manufactured in a silicon process line. A wafer is transferred to an outsourcing company after the silicon process and there, a color filter is manufactured. This increases the tact time of the product and raises a cost.

In addition to the above-mentioned problem, the organic material serving as a raw material of the color filter changes in quality under a high-temperature environment. An image-sensor using a color filter is therefore not suited for use in, for example, an in-car digital camera. This is because the temperature of, for example, an engine room of a car increases even to 125° C. while the car runs. Further, when an incident light passes through the color filter, its intensity is attenuated by about 30% or more but 50% or less.

For example, the following patent documents disclose a method of analyzing the light quantity for each color of a light, that is, for each wavelength of a light in order to overcome the above-mentioned problems.

PATENT DOCUMENTS

[Patent Document 1] Japanese Patent Laid-Open No. 2004-221506
[Patent Document 2] International Publication No. 2011/067879
[Patent Document 3] Japanese Patent Laid-Open No. 2008-283057
[Patent Document 4] Japanese Patent Laid-Open No. 2008-283058
[Patent Document 5] Japanese Patent Laid-Open No. 2009-5061
[Patent Document 6] Japanese Patent Laid-Open No. Hei 4(1992)-72664

SUMMARY

In Patent Documents 1 and 2, a plurality of photoelectric conversion elements (pn junctions) are stacked one after another in one pixel region and the photoelectric conversion elements each have a configuration designed to have a thickness or depth optimum for them to perform multicolor separation. Increasing the number of pn junctions formed in one pixel region may increase a leakage current undesirably flowing in a lightless place and deteriorate the quality of an output image.

In Patent Documents 3, 4, and 5, a photoelectric conversion element sensitive to from a short-wavelength light to a long-wavelength light is formed and it changes a bias voltage to be applied to a carrier extraction region provided in a pixel. This changes an extraction depth of electrons and differentiates spectral characteristics, making it possible to achieve spectral characteristics different, depending on colors. Even when spectral characteristics corresponding to each color can be achieved only by a single photoelectric conversion element, however, the image quality of a pixel thus output may become inferior to that of a typical image sensor using a plurality of photoelectric conversion elements for respective colors.

In Patent Document 6, detection sensitivity of charges available by photoelectric conversion of a light of each color is enhanced by changing the depth of a pixel for each color. In this document, however, a p well configuring a red-color detecting pixel requiring the greatest depth is formed by ion implantation. In this case, the p well that can be formed has a depth limit so that charges formed by photoelectric conversion that occurs in a region deeper than the depth limit cannot be detected and the sensitivity of charges decreases accordingly. Deterioration in the image quality of a pixel thus output may occur also in the method disclosed in this patent document.

Another object and novel features will be apparent from the description herein and accompanying drawings.

A semiconductor device according to one embodiment has a p type semiconductor substrate and first, second, and third pixel regions. The first, second, and third pixel regions each have a p type well region formed in the p type semiconductor substrate and an n type region configuring a pn junction with the p type well region. The p type well region of the first pixel region has a depth, from the main surface to the lowermost portion most distant therefrom, smaller than that of the p type well region of the second and third pixel regions. On the side opposite to the main surface of the p type well region of the first and second pixel regions, a buried p type well region contiguous to the p type well region is placed further.

A method of manufacturing the semiconductor device according to the one embodiment includes forming a buried p type well region in a p type semiconductor substrate in respective regions to be first and second pixel regions, forming a p type well region in the main surface in respective regions to be first, second and third pixel regions, and forming, in the main surface in the p type well, an n type region configuring a pn junction with the p type well region. The buried p type well region in the first pixel region is shallower than the buried p type well region in the second pixel region. The p type well region contiguous to the buried p type well region is formed on the main surface side thereof. The p type well region in the first pixel region has a depth, from the main surface to the lowermost portion most distant therefrom, smaller than that of the p type well region in the second and third pixel regions.

A method of controlling the semiconductor device according to the one embodiment includes detecting, as a short wavelength light receiving quantity, a signal value obtained based on the first number of collected charges in a photo diode obtained by photoelectric conversion in the first pixel region; detecting, as a middle wavelength light receiving quantity, a difference obtained by subtracting a signal value obtained based on the first number of collected charges in a photo diode from a signal value obtained based on the second number of collected charges in a photo diode obtained by photoelectric conversion in the second pixel region; and detecting, as a long-wavelength light receiving quantity, a value obtained by subtracting a signal value obtained based on the second number of collected charges in a photo diode from a signal value obtained based on the third number of collected charges in a photo diode obtained by photoelectric conversion in the third pixel region.

In the semiconductor device of the one embodiment and manufacturing method thereof, the first to third pixel regions enable detection of a light of each color without a color filter. In addition, the third pixel region enables detection of charges obtained by photoelectric conversion of a long-wavelength light in a deep region distant from the main surface. As a result, the semiconductor device is able to provide an image with improved image quality.

By the control method of the semiconductor device of the one embodiment, the semiconductor device is able to provide an image with improved image quality because using the collected number of charges detected in the first to third pixel regions enables highly accurate analysis of the light receiving quantity of each color.

BRIEF DESCRIPTION OF THE DRAWINGS

FIG. 3 is a schematic enlarged plan view of the region III encircled with the dotted circle in FIG. 2;

DETAILED DESCRIPTION

One embodiment will next be described based on some drawings.

First Embodiment

Figure 1:
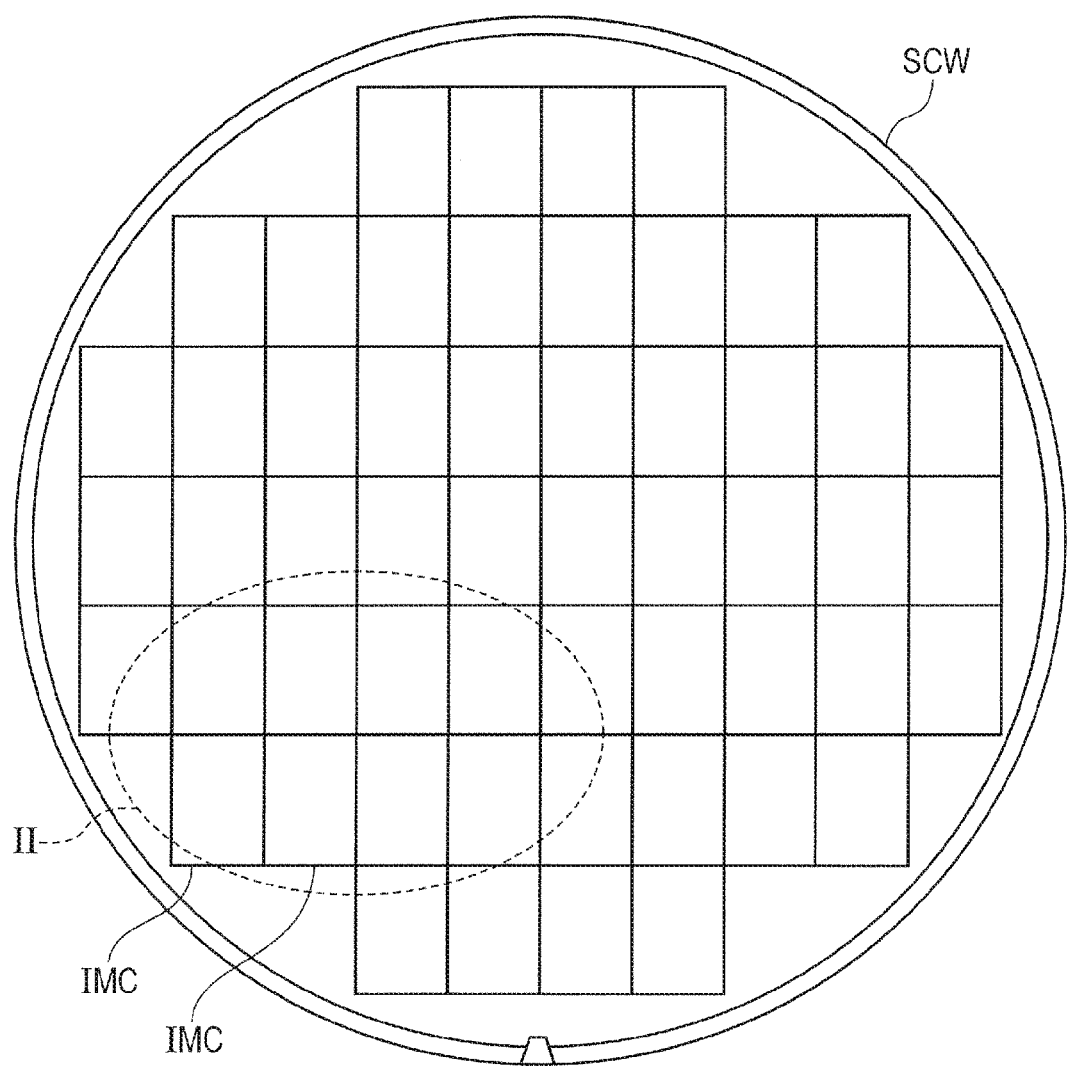
FIG. 1 is a schematic plan view showing a semiconductor device in wafer form according to First Embodiment.
Figure 2:
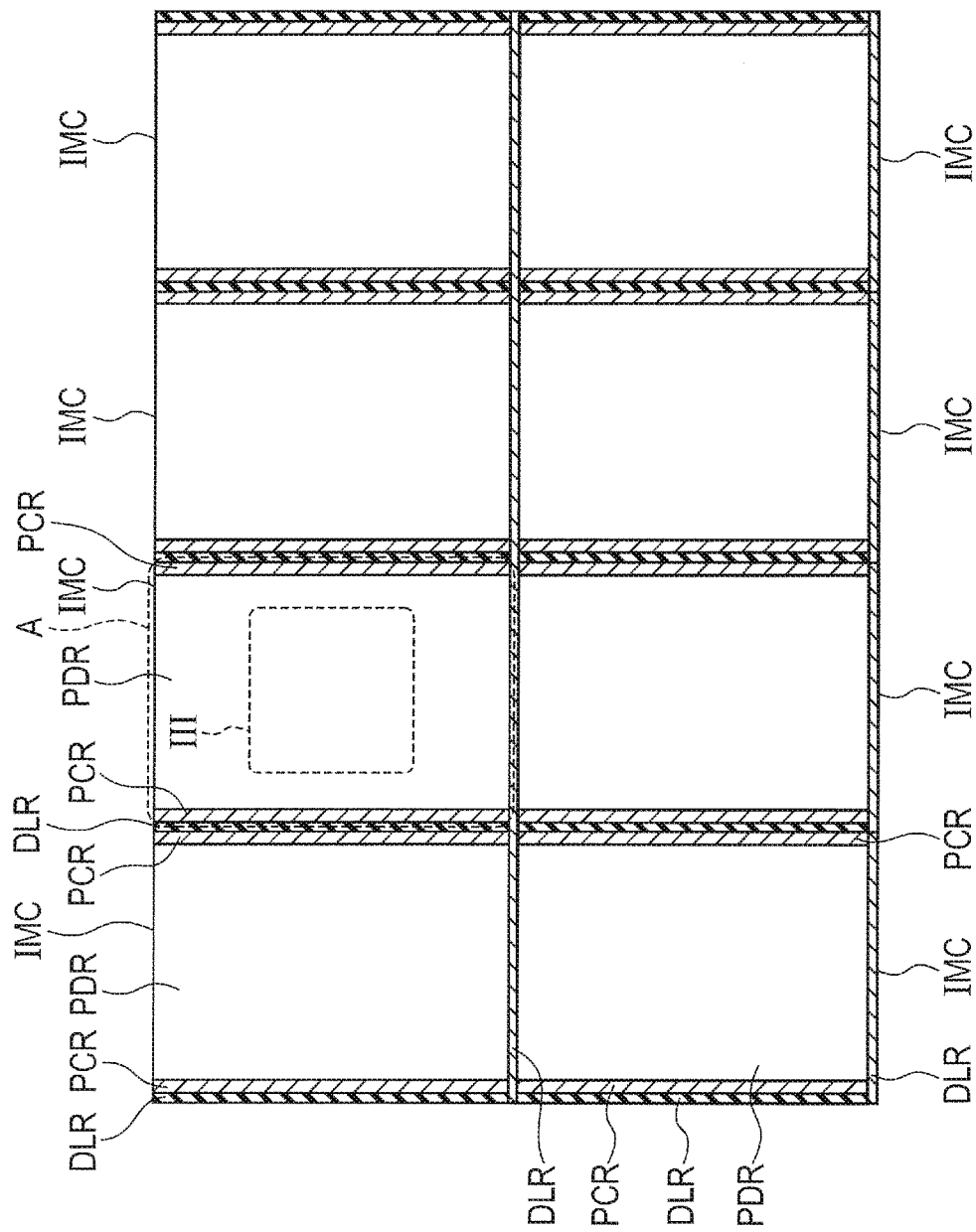
FIG. 2 is a schematic enlarged plan view of the region II encircled with the dotted circle in FIG. 1.

First, a semiconductor device, in wafer form, of the present embodiment is described referring to FIGS. 1 and 2.

As FIG. 1 shows, a semiconductor wafer SCW has a plurality of chip regions IMC for image sensor. The chip regions IMC each have a rectangular planar shape and they are placed in a matrix form.

As FIG. 2 shows, the chip regions IMC each have, as a photoelectric conversion element, for example, a pixel portion PDR which is a formation region of a photodiode and a peripheral circuit portion PCR which is a formation region of a peripheral circuit for controlling the photodiode. The peripheral circuit portion PCR lies, for example, on both sides of the pixel portion PDR. The chip regions IMC have therebetween a dicing line region DLR. This dicing line region DLR has therein an alignment mark. The semiconductor wafer SCW is divided into a plurality of semiconductor chips by being diced along this dicing line region DLR.

Figure 3:
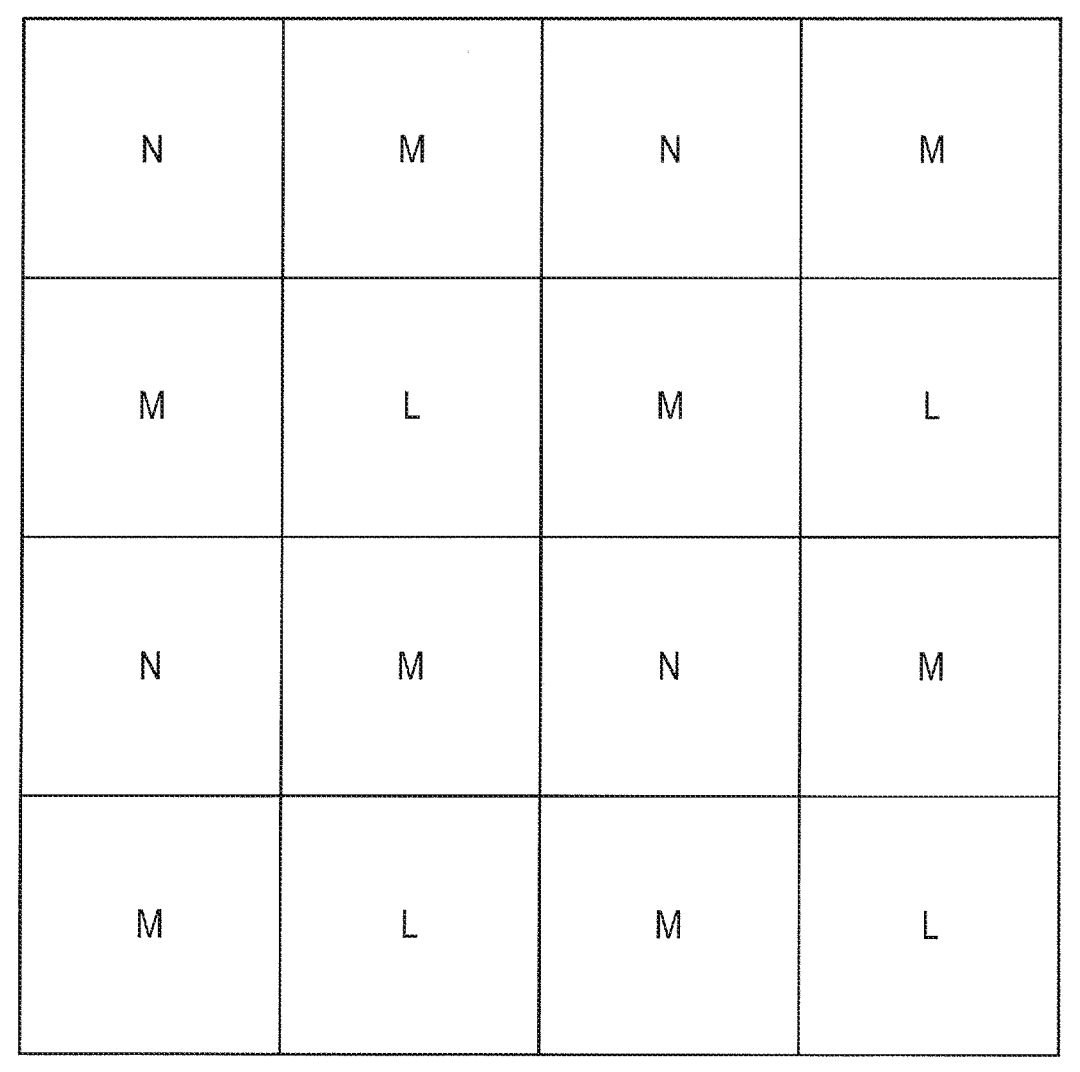
Figure 4:
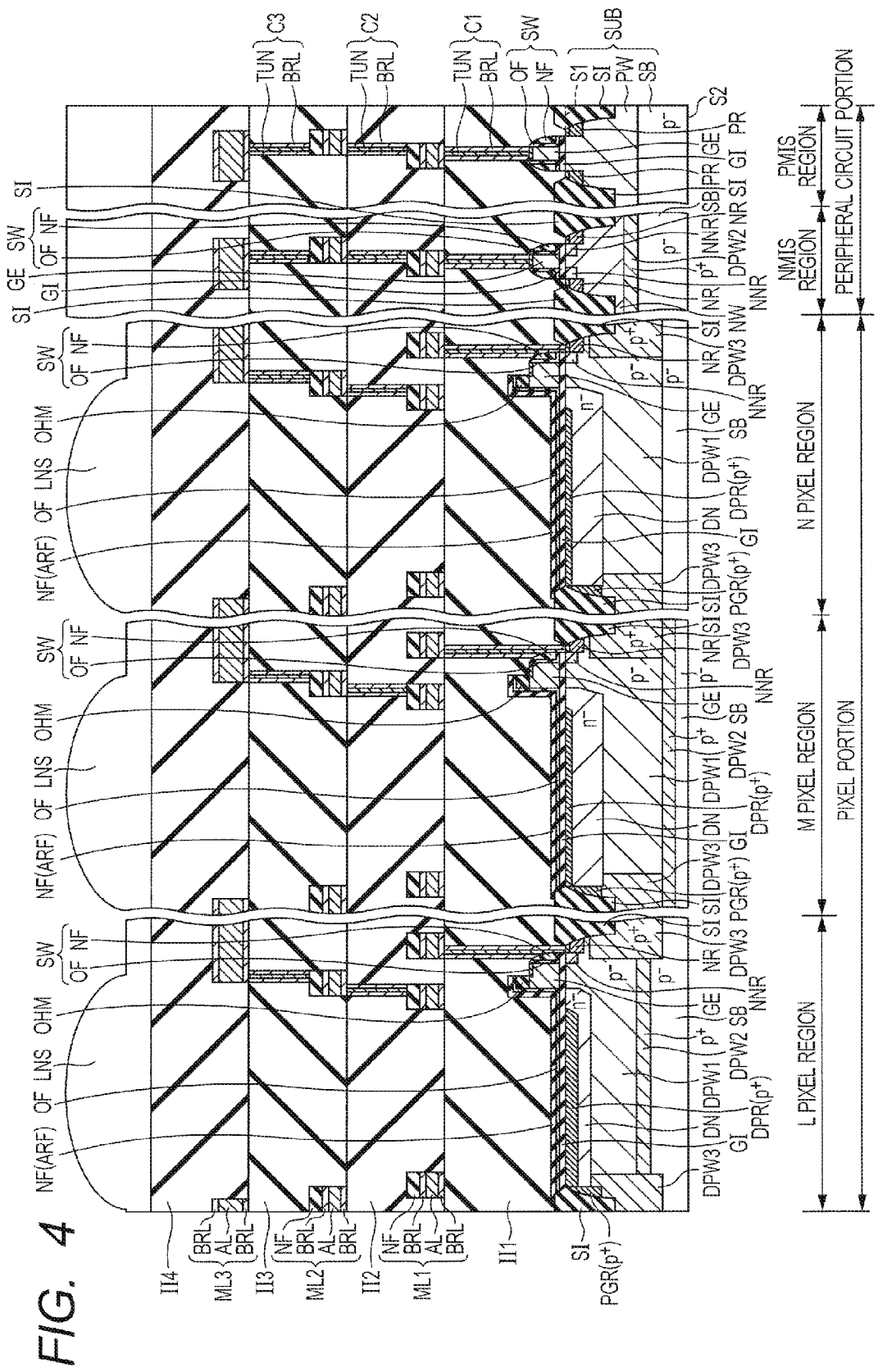
FIG. 4 is a schematic cross-sectional view showing the configuration of the semiconductor device of First Embodiment in the region A encircled with the dotted line in FIG. 2.

Next, the configuration of a photo diode in the pixel portion PDR and the peripheral circuit portion PCR is described referring to FIGS. 3 and 4.

As FIG. 3 shows, the pixel portion PDR formed in each of the chip regions IMC shown in FIG. 2 has a plurality of pixel regions, for example, arrayed to each other in plan view. More specifically, these pixel regions are L pixel regions (represented by "L" in FIG. 3) as a first pixel region, M pixel regions (represented by "M" in FIG. 3) as a second pixel region, and N pixel regions (represented by "N" in FIG. 3) as a third pixel region. Although not shown in FIG. 3, the pixel regions (L pixel regions, M pixel regions, N pixel regions) adjacent to each other typically have therebetween a predetermined distance.

A single unit pixel is comprised of a total of four pixel regions configuring arbitrary two rows×two columns in FIG. 3. This single unit pixel has one L pixel region, two M pixel regions, and one N pixel region. Two M pixel regions are arranged in a diagonal direction in the arrangement in a matrix form. The L pixel region and the N pixel region are adjacent to the M pixel region in both the row direction and the column direction in a matrix form. In other words, the L pixel region and the N pixel region are sandwiched between the M pixel regions in both the row direction and the column direction.

As shown in FIG. 4, the chip regions IMC in FIG. 2 and the semiconductor wafer SCW are comprised of a p⁻ region SB of a p type semiconductor substrate SUB made of, for example, silicon. The semiconductor substrate SUB has main surfaces S1 and S2. The main surface S1 of the semiconductor substrate SUB is designated as a main surface on the side where a photodiode in each pixel region is formed and the main surface S2 is designated as a main surface on the side opposite to the main surface S1.

The semiconductor substrate SUB in the pixel portion PDR (refer to FIG. 2) in the chip region IMC has therein the L pixel region, M pixel region, and N pixel region shown in FIG. 3. The L pixel region, M pixel region, and N pixel region of the pixel portion PDR each have a photodiode. This means that the L pixel region is a region in which a photodiode as an L pixel is to be formed and similarly, the M pixel region is a region in which a photodiode as an M pixel is to be formed and the N pixel region is a region in which a photodiode as an N pixel is to be formed.

For example, the photodiode of the L pixel region and the M pixel region has a configuration obtained by stacking a buried p type well region DPW2, a p type well region DPW1, an n type region DN, and a p type region DPR in order of mention. The photodiode of the N pixel region has a configuration obtained by stacking a p type well region DPW1, an n type region DN, and a p type region DPR in order of mention. In both the photodiode of the L pixel region and the M pixel region and the photodiode of the N pixel region, the above-mentioned regions are preferably arranged in the above-mentioned order in the perpendicular direction in FIG. 4, that is, in a direction perpendicular to the main surfaces S1 and S2 of the semiconductor substrate SUB.

The buried p type well region DPW2 is a thin p⁺ type impurity region extending in the semiconductor substrate SUB, particularly in the p⁻ region SB of the semiconductor substrate SUB, in a direction along the main surfaces S1 and S2. This means that the p type impurity concentration of the buried p type well region DPW2 is higher than the p type impurity concentration of the p⁻ region SB configuring the semiconductor substrate SUB.

Only the L pixel region and the M pixel region have therein the buried p type well region DPW2 and the N pixel region does not have it therein.

The p type well region DPW1 is formed in the semiconductor substrate SUB so as to occupy a large portion of the semiconductor substrate SUB in each pixel region. The p type well region DPW1 is formed preferably, for example, in the main surface S1 of the semiconductor substrate SUB. The p type well region DPW1 is formed as a p⁻ region but the p type impurity concentration in the p type well region DPW1 may be higher than the p type impurity concentration of the p⁻ region SB configuring the semiconductor substrate SUB.

The p type well region DPW1 of the L pixel region has a depth, from the main surface S1 to the lowermost portion most distant therefrom in the perpendicular direction of the drawing, smaller than that of the p type well region DPW1 of the M pixel region and the N pixel region. In other words, the p type well region DPW1 of the L pixel region has a distance, from the main surface S1 to the lowermost portion in the perpendicular direction of the drawing, shorter than that of the p type well region DPW1 of the M pixel region and the N pixel region. Further, it means that particularly when the p type well region DPW1 is formed in the main surface S1 of the semiconductor substrate SUB, the p type well region DPW1 of the L pixel region is thinner, in the perpendicular-direction thickness in FIG. 4, than the p type well region DPW1 of the M pixel region and the N pixel region.

The p type well region DPW2 of the M pixel region lies in a region deeper from the main surface S1 of the semiconductor substrate SUB than the p type well region DPW2 of the L pixel region, that is, in a region more distant from the main surface S1. The buried p type well region DPW2 is, in the L pixel region and the M pixel region, contiguous to the p type well region DPW1 on the lower side of the p type well region DPW1, that is, on the side of the main surface S2 (on the side opposite to the main surface S1). As described above, the lowermost portion of the p type well region DPW1 in the L pixel region lies at a position shallower than that in the M pixel region. The buried p type well region DPW2 contiguous to the lowermost portion of the p type well region DPW1 in the L pixel region therefore lies in a region closer to the main surface S1 than the buried p type well region DPW2 contiguous to the lowermost portion of the p type well region DPW1 in the M pixel region, that is, in a region shallower from the main surface S1.

The n type region DN is an n region formed in the p type well region DPW1 and configures a pn junction with the p type well region DPW1. The n type region DN is preferably formed, for example, in the main surface S1 of the semiconductor substrate SUB and the n type region DN is typically formed so as to have the lowermost portion, most distant from the main surface S1, shallower than the lowermost portion of the p type well region DPW1 (thinner than the p type well region DPW1). In this case, the lowermost portion of the n type region DN is contiguous to the p type well region DPW1 in which it is formed and hence a pn junction is formed therebetween. This pn junction forms a depletion layer that traps charges generated through photoelectric conversion by the photodiode.

The n type region DN in the L pixel region is thinner than the n type region DN in the M pixel region and the N pixel region. In other words, for example, when the n type region DN of each pixel region is formed in the main surface S1 of the semiconductor substrate SUB, the lowermost portion, most distant from the main surface S1, of then type region DN in the L pixel region is formed in a region having a distance from the main surface S1 (a perpendicular-direction distance in the drawing) shorter than the lowermost portion, most distant from the main surface S1, of then type region DN in the M pixel region and N pixel region.

The p type region DPR is a p$^+$ region formed in the n type region DN. The p type region DPR is preferably formed, for example, in the main surface S1 of the semiconductor substrate SUB. The lowermost portion of the p type region DPR most distant from the main surface S1 is typically shallower than the lowermost portion of the n type region DN (p type region is thinner than the n type region DN). In this case, the lowermost portion of the p type region DPR is contiguous to then type region DN in which it is formed and hence, a pn junction is formed between them.

The p type region DPR in the L pixel region is thicker than the p type region DPR in the M pixel region and N pixel region. In other words, for example, when the p type region DPR of each pixel region is formed in the main surface S1 of the semiconductor substrate SUB, the lowermost portion, most distant from the main surface S1, of the p type region DPR in the L pixel region is formed in a region having a distance (a perpendicular-direction in the drawing) from the main surface S1 longer than the lowermost portion, most distant from the main surface S1, of the p type region DPR in the M pixel region and N pixel region.

The L pixel region, M pixel region, and N pixel region each have therein an MIS (metal insulator semiconductor) transistor such as transfer transistor so as to include a photodiode. Particularly, the transfer transistor has a set of source and drain regions DN, NMR, and NR, a gate insulating film GI, and a gate electrode GE. Particularly the n type region DN of the above-mentioned photodiode is integrated with the source region of the transfer transistor.

The n type region DN, the lightly doped n type impurity region NNR, and the n type impurity region NR configuring a set of source and drain regions of the transfer transistor are each placed, for example, in the main surface S1 of the semiconductor substrate SUB in the p type well region DPW1 at intervals. The n type impurity region NR as a drain region of the transfer transistor is an n$^+$ impurity region as a heavily doped region and the lightly doped n type impurity region NNR is an n$^-$ type impurity region as a so-called LDD (lightly doped drain). The main surface S1 of the semiconductor substrate SUB sandwiched among the set of the source region DN and the drain regions NNR and NR has thereon a gate electrode GE via a gate insulating film GI.

The semiconductor substrate SUB has, on the main surface S1 thereof, a stacked film of a silicon oxide film OF and a silicon nitride film NF in order of mention so as to cover therewith the photodiode (the source region of the transfer transistor). The silicon nitride film NF of these films serves as an anti-reflective film ARF. The silicon oxide film OF and the silicon nitride film NF each climb, at one end thereof, on a portion of the gate electrode GE on one side.

The gate electrode GE has, on a portion thereof on one side, a hard mask OHM made of oxide film and the silicon oxide film OF and the anti-reflective film ARF may be formed so as to climb on this hard mask OHM made of oxide film. The gate electrode GE has, on a sidewall thereof on the other side, a sidewall insulating film SW made of the silicon oxide film OF and the silicon nitride film NF as a residue of the silicon oxide film OF and the anti-reflective film ARF.

Any two of the L pixel region, the M pixel region, and the N pixel region adjacent to each other (for example, adjacent in a row direction or column direction of the matrix form) have, in the main surface S1 therebetween, a p$^+$ region as a p-type well DPW3 located in the pixel boundary region. The p-type well DPW3 located in the pixel boundary region lies, for example, in a region between any two pixel regions adjacent to each other in the row direction or column direction among the L pixel region, the M pixel region, and the N pixel region shown in FIG. 3.

The main surface S1 between two adjacent pixel regions may have an element isolation insulating film SI. The element isolation insulating film SI is a so-called STI (shallow trench isolation) film made of, for example, a silicon oxide film. The element isolation insulating film SI has preferably a cross-sectional shape whose width in a horizontal direction of the drawing is narrower, compared with in a region nearest to the main surface S1, in a region on the side therebelow (on the side of the main surface side S2).

The element isolation insulating film SI may have, on the lateral portion thereof on the side of the n type region DN, a p type guard ring region PGR as a p$^+$ region. This p type guard ring region PGR is provided in order to suppress a minute leakage current between two pixel regions adjacent to each other.

In FIG. 4, in the pixel portion PDR of the chip region IMC, the L pixel region, the M pixel region, and the N pixel region are arranged in a straight line in a horizontal direction in the drawing. They are arranged in such a manner so as to facilitate description. In practice, these pixel regions are arranged as shown in FIG. 3 in plan view. A region between these pixel regions is omitted from FIG. 4, but these regions may have, similar to the end portion of each of the pixel regions, the p-type well DPW3 located in the pixel boundary region, the element isolation insulating film SI, and the like.

On the other hand, the peripheral circuit portion PCR of the chip region IMC has, in the semiconductor substrate SUB thereof, for example, a control element such as MIS transistor. This MIS transistor has a so-called NMIS region having an n type MIS transistor and a so-called PMIS region having a p type MIS transistor.

The semiconductor substrate SUB in the NMIS region has therein a buried p type well region DPW2 and an n type well region NW stacked one after another in order of mention. Then type well region NW lies, for example, in the main surface S1. The buried p type well region DPW2 is, similar to the buried p type well region DPW2 of the pixel portion PDR, a thin-film $p^+$ region extending along the main surface S1 of the semiconductor substrate SUB and is contiguous to the lowermost portion of the n type well region NW most distant from the main surface S1 in the perpendicular direction of the drawing.

The n type MIS transistor has a pair of source and drain regions NNR and NR, a gate insulating film GI, and a gate electrode GE. The source region and the drain region are, similar to the drain region of each pixel region, comprised of a lightly doped n type impurity region NNR and an n type impurity region NR. The main surface S1 of the semiconductor substrate SUB sandwiched between the pair of n type source and drain regions NNR and NR has thereon a gate electrode GE via a gate insulating film GI. The gate electrode GE has, on the sidewall thereof, a sidewall insulating layer SW made of a silicon oxide film OF and a silicon nitride film NF as a residue of the insulating film on the photodiode including the anti-reflective film ARF.

The semiconductor substrate SUB in the PMIS region has therein a p type well region PW. The p type well region PW lies, for example, in the main surface S1.

The p type MIS transistor has a pair of source and drain regions PR, a gate insulating film GI, and a gate electrode GE. The source region and the drain region are each made of a p type impurity region PR. The main surface S1 of the semiconductor substrate SUB sandwiched between the pair of p type source and drain regions PR has thereon a gate electrode GE via a gate insulating film GI. The gate electrode GE has, on the sidewall thereof, a sidewall insulating layer SW made of a silicon oxide film OF and a silicon nitride film NF as a residue of the insulating film on the photodiode including the antireflective film ARF.

Also in the peripheral circuit portion PCR, a region between the NMIS region and the PMIS region has, similar to a region between the pixel regions in the pixel portion PDR, an STI film as the element isolation insulating film SI.

In each of the pixel regions of the pixel portion PDR and in each of the regions of the peripheral circuit portion PCR, the semiconductor substrate SUB has, on the main surface S1 thereof, an interlayer insulating film II1 that covers therewith an upper portion of the above-mentioned elements (photodiode, MIS transistor). In the pixel portion PDR and the peripheral circuit portion PCR, the interlayer insulating film II1 has thereon a patterned first-layer metal wiring ML1. This first-layer metal wiring ML1 is electrically coupled to, for example, the drain region NR of the pixel portion or the gate electrode GE of the peripheral circuit portion via a contact layer C1 comprised of, for example, a conductive layer TUN made of a thin tungsten film and a barrier metal layer BRL that fill the contact hole in the interlayer insulating film II1.

The metal wiring ML1 has a configuration obtained by stacking, for example, a bather metal layer BRL, an aluminum layer AL, a barrier metal layer BRL, and a silicon nitride film NF one after another in order of mention. The aluminum layer AL is made of a thin metal film such as aluminum. The bather metal layers BRL sandwich therebetween the aluminum layer AL in the perpendicular direction of the drawing so as to suppress the metal element from diffusing from the aluminum layer AL in the perpendicular direction. The silicon nitride film NF which is the uppermost layer prevents reflection of a light irradiated from above in FIG. 4.

The interlayer insulating film II1 has thereon an interlayer insulating film II2 so as to cover therewith an upper portion of the metal wiring ML1. In the pixel portion PDR and the peripheral circuit portion PCR, the interlayer insulating film II2 has thereon a patterned second-layer metal wiring ML2. This second-layer metal wiring ML2 is electrically coupled to, for example, the metal wiring ML1 of each of the pixel portion and the peripheral circuit portion via a contact layer C2 comprised of, for example, a conductive layer TUN made of a thin tungsten film and a barrier metal layer BRL that fill the contact hole of the interlayer insulating film II2. The metal wiring ML2 has, similar to the metal wiring ML1, for example a configuration obtained by stacking a bather metal layer BRL, an aluminum layer AL, a bather metal layer BRL, and a silicon nitride film NF one after another in order of mention.

The interlayer insulating film II2 has thereon an interlayer insulating film II3 so as to cover therewith an upper portion of the metal wiring ML2. In the pixel portion PDR and the peripheral circuit portion PCR, the interlayer insulating film II3 has thereon a patterned third-layer metal wiring ML3. This third-layer metal wiring ML3 is electrically coupled to, for example, the metal wiring ML2 of each of the pixel portion and the peripheral circuit portion via a contact layer C3 comprised of, for example, a conductive layer TUN made of a thin tungsten film and a barrier metal layer BRL that fill the contact hole of the interlayer insulating film II3. The metal wiring ML3 has, for example, a configuration obtained by stacking a bather metal layer BRL, an aluminum layer AL, and a barrier metal layer BRL one after another in order of mention. The metal wiring ML3 may however include a silicon nitride film NF similar to the metal wirings ML1 and ML2.

The interlayer insulating film II3 has thereon an interlayer insulating film II4 so as to cover an upper portion of the metal wiring ML3. A condenser lens LNS lies on the interlayer insulating film II and at the same time, immediately above the photodiode of each pixel region. This condenser lens LNS is a lens for collecting light and then irradiating it to a photodiode.

It is preferred that the interlayer insulating films II1 to II4 are each made of, for example, a silicon oxide film and the barrier metal layer BRL is made of, for example, a thin film of a titanium nitride compound.

Next, a method of manufacturing the semiconductor device of the present embodiment is described referring to FIGS. 5 to 25.

First, a semiconductor substrate SUB made of a semiconductor material, which differs depending on the wavelength of light to be irradiated upon use, such as silicon or germanium is provided. This semiconductor substrate SUB includes a p⁻ region SB containing a relatively low concentration p type impurity and has main surfaces S1 and S2. The semiconductor substrate SUB has a pixel portion and a peripheral circuit portion partitioned (provided). The pixel portion has an L pixel region (a region to be this region), an M pixel region (a region to be this region), and an N pixel region (a region to be this region) which are partitioned to each other, while the peripheral circuit portion has an NMIS region (a region to be this region) and a PMIS region (a region to be this region) which are partitioned from each other. The L pixel region (a region to be this region), the M pixel region (a region to be this region), and the N pixel region (a region to be this region) are preferably arranged in a matrix form in plan view as shown in FIG. 3.

A silicon oxide film OX and a silicon nitride film NF are formed in order of mention, for example, by CVD (chemical vapor deposition) on a substantial entirety of the main surface S1 of the semiconductor substrate SUB. Next, a photoresist as an unillustrated photoreceptor is applied onto the silicon nitride film NF. The silicon oxide film OX and the silicon nitride film NF are removed by typical photolithography and etching from the boundary between the pixel regions of the pixel portion and the vicinity thereof and the boundary between the MOS transistor regions of the peripheral circuit region and the vicinity thereof. As a result, a pattern made of a stacked film structure of the silicon oxide film OX and the silicon nitride film NF is formed in each of the pixel regions and each of the MOS transistor regions.

After removal of the photoresist, with the pattern of the silicon nitride film NF as a mask, the semiconductor substrate SUB (p⁻ region SB) immediately below a region from which the silicon oxide film OX and the silicon nitride film NF have been removed by the above-mentioned step is partially removed to form a trench TCH1.

Figure 6:
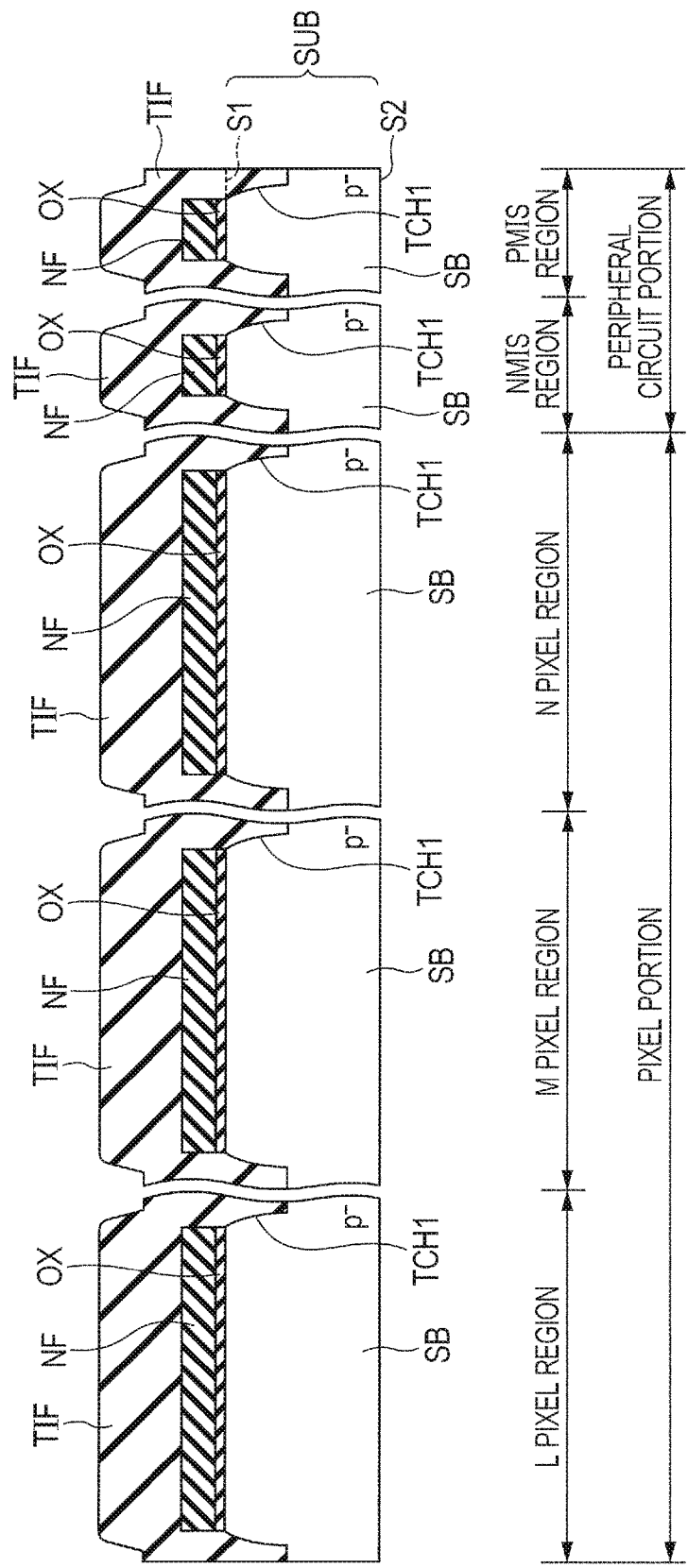
FIG. 6 is a schematic cross-sectional view showing a second step of the manufacturing method of the semiconductor device of First Embodiment.

As FIG. 6 shows, for example, a silicon oxide film as a trench insulating film TIF is formed on the silicon nitride film NF, for example, by CVD so as to fill the trench TCH1.

Figure 7:
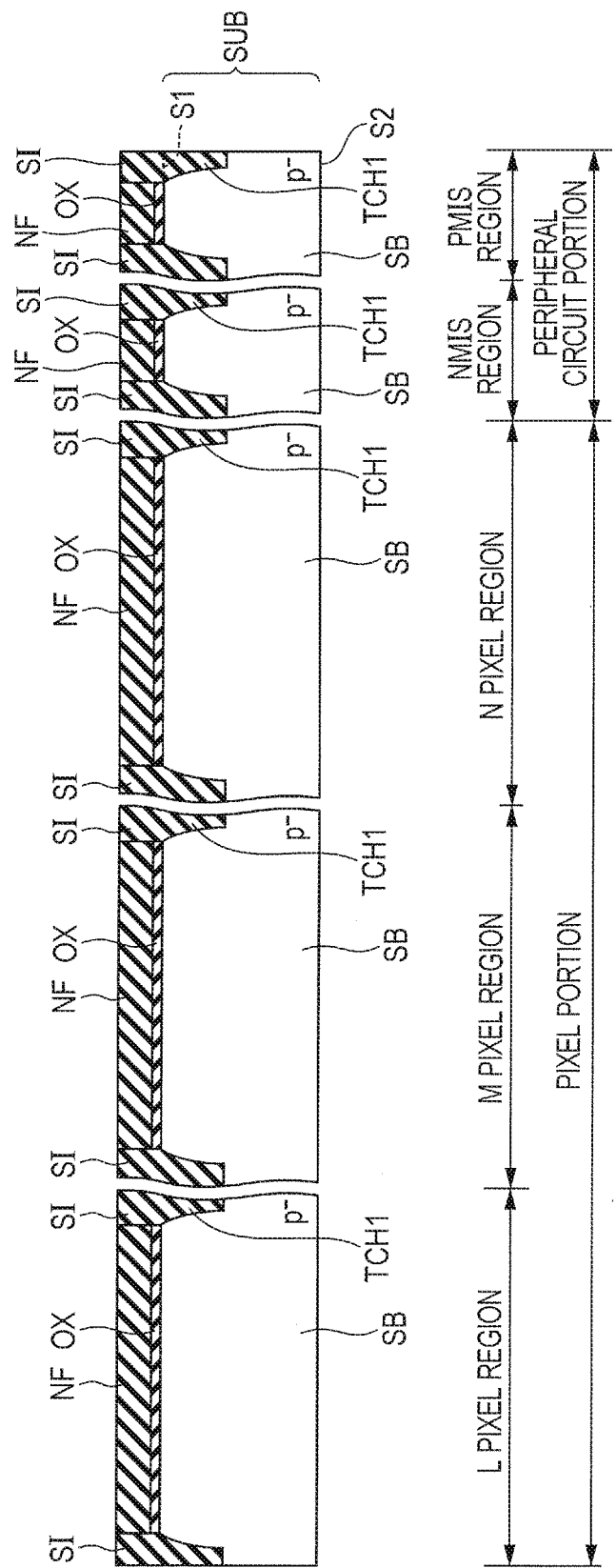
FIG. 7 is a schematic cross-sectional view showing a third step of the manufacturing method of the semiconductor device of First Embodiment.

As FIG. 7 shows, the trench insulating film TIF on the silicon nitride film NF is removed, for example, by chemical mechanical polishing called "CMP" to leave the trench insulating film TIF in the trench TCH1. The trench insulating film TIF which has remained in the trench TCH1 becomes an element isolation insulating film SI and the upper surface of it becomes a flat surface almost flush with the upper surface of the silicon nitride film NF. The element isolation insulating film SI is an insulating film formed, for example, between a photodiode to be formed in the L pixel region and a photodiode to be formed in the M pixel region in order to electrically insulate therebetween.

Figure 8:
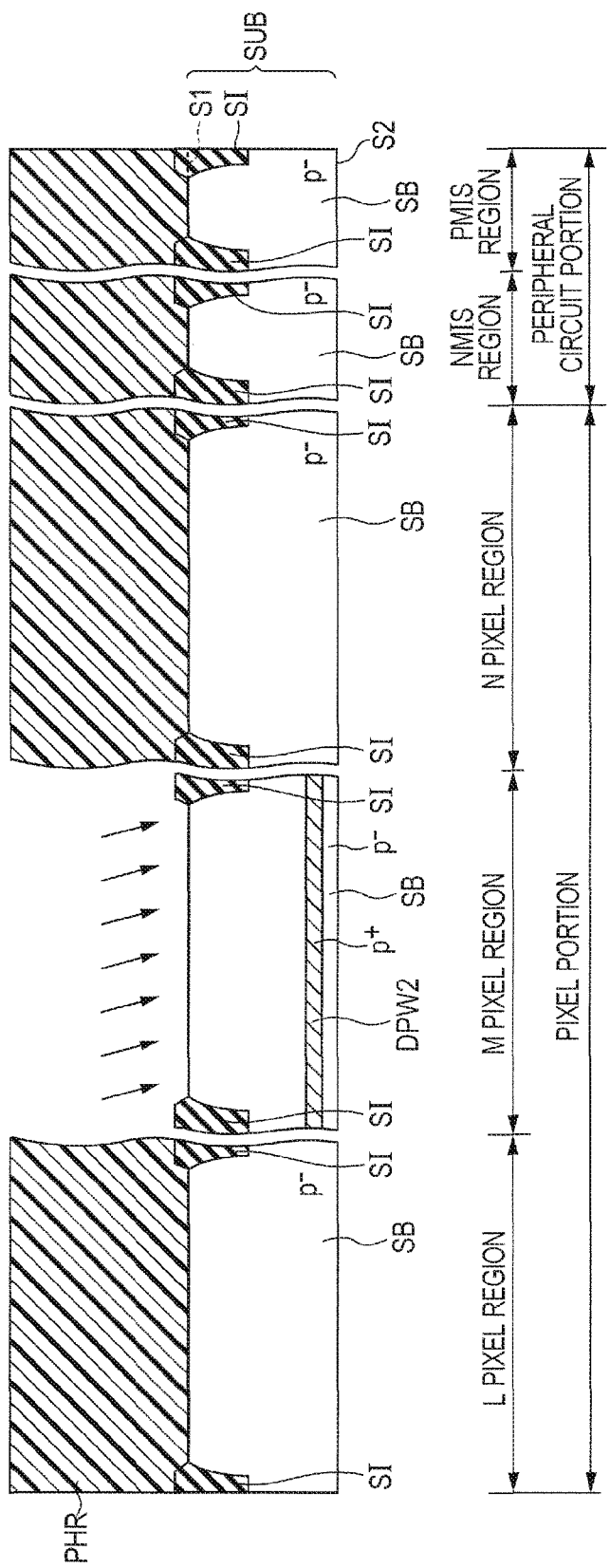
FIG. 8 is a schematic cross-sectional view showing a fourth step of the manufacturing method of the semiconductor device of First Embodiment.

As FIG. 8 shows, the silicon oxide film OX and the silicon nitride film NF are removed by etching so that the corner of the element isolation insulating film SI in its cross-sectional view is partially removed by etching.

Next, a photoresist PHR as a photoreceptor is applied again onto a substantial entirety of main surface S1 of the semiconductor substrate SUB. By typical photolithography, the photoresist PHR in a region to be an M pixel region is removed. The photoresist PHR therefore has an opening in the region to be an M pixel region.

Next, by typical ion implantation, p type impurity ions are implanted into the p⁻ region SB in the region to be an M pixel region. As a result, a buried p type well region DPW2 is formed in the p⁻ region SB in the region to be an M pixel region. The buried p type well region DPW2 is formed preferably in a deep region relatively distant from the main surface S1 (relatively close to the main surface S2) in the semiconductor substrate SUB (p⁻ region SB). The arrow in FIG. 8 shows an ion implantation direction, but impurity ions may be implanted in a direction slightly inclined to a direction perpendicular to the main surface S1.

Figure 9:
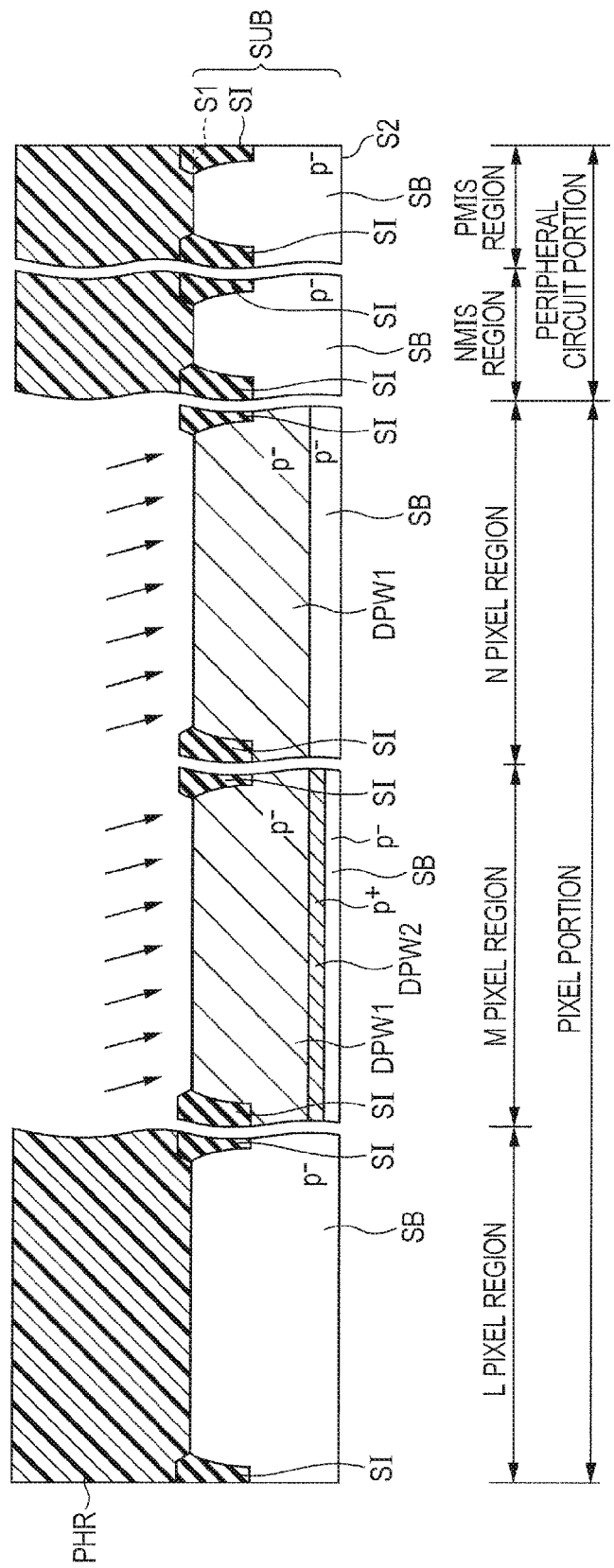
FIG. 9 is a schematic cross-sectional view showing a fifth step of the manufacturing method of the semiconductor device of First Embodiment.

As FIG. 9 shows, after removal of the photoresist PHR shown in FIG. 8 by ashing or the like, a photoresist PHR is applied again onto a substantial entirety of the main surface S1 of the semiconductor substrate SUB. An opening of the photoresist PHR is formed in the region to be an M pixel region and a region to be an N pixel region. Under such a state, p type impurity ions are implanted into the p⁻ region SB from above the main surface S1 by typical ion implantation. A p type well region DPW1 is thereby formed in the p⁻ region SB in the region to be an M pixel region and a region to be an N pixel region. The p type well region DPW1 is formed preferably so as to extend in the perpendicular direction of the drawing from the main surface S1 to the depth of the uppermost surface of the buried p type well region DPW2 of FIG. 8. As a result, the p type well region DPW1 is formed so as to be contiguous to the uppermost surface of the buried p type well region DPW2 on the side of the main surface S1. During this ion implantation, impurity ions may also be implanted in a direction slightly inclined to a direction perpendicular to the main surface S1.

Figure 10:
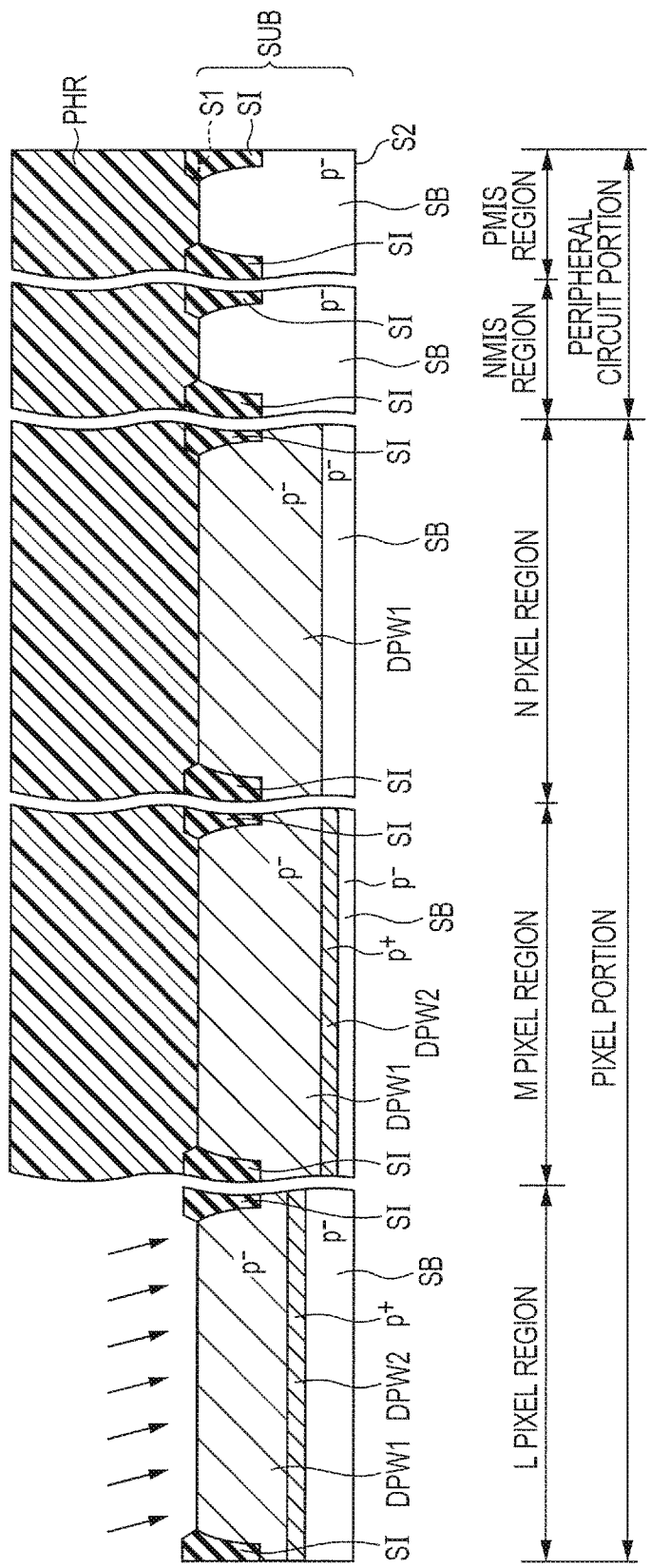
FIG. 10 is a schematic cross-sectional view showing a sixth step of the manufacturing method of the semiconductor device of First Embodiment.

As FIG. 10 shows, after removal of the photoresist PHR of FIG. 9 by ashing or the like, a photoresist PHR is applied onto a substantial entirety of the main surface S1 of the semiconductor substrate SUB again and by typical photolithography, an opening of the photoresist PHR is formed in a region to be an L pixel region. Under such a state, p type impurity ions are implanted into the p⁻ region SB by typical ion implantation from above the main surface S1. A buried p type well region DPW2 is thereby formed in the p⁻ region SB in the region to be an L pixel region.

Upon forming the buried p type well region DPW2 in the region to be an L pixel region, it is preferably formed so that a distance of it in the perpendicular direction in the drawing from the main surface S1 to the lowermost portion most distant therefrom becomes shorter than the distance, from the main surface S1 to the lowermost portion most distant therefrom, of the buried p type well region DPW2 in the region to be an M pixel region and the p type well region DPW1 in the region to be an N pixel region.

Next, p type impurity ions are implanted into the p⁻ region SB by typical ion implantation from above the main surface S1. A p type well region DPW1 is thereby formed in the p⁻ region SB in the region to be an L pixel region. The p type well region DPW1 extends in the perpendicular direction of the drawing from the main surface S1 to the uppermost surface of the buried p type well region DPW2. As a result, the p type well region DPW1 is brought into contact with the uppermost surface of the buried p type well region DPW2 on the side of the main surface S1.

Since the buried p type well region DPW2 in the region to be an L pixel region is formed at a position shallower than that of the buried p type well region DPW2 in the regions to be M and N pixel regions, respectively, so that the p type well region DPW1 of the L pixel region formed so as to be contiguous to the uppermost surface of the p type well region DPW2 has a smaller depth from the main surface S1 to the lowermost portion most distant therefrom than the p type well region DPW1 of the M or N pixel region. During ion implantation, similar to that descried above, impurity ions may be implanted in a direction slightly inclined to a direction perpendicular to the main surface S1.

Figure 11:
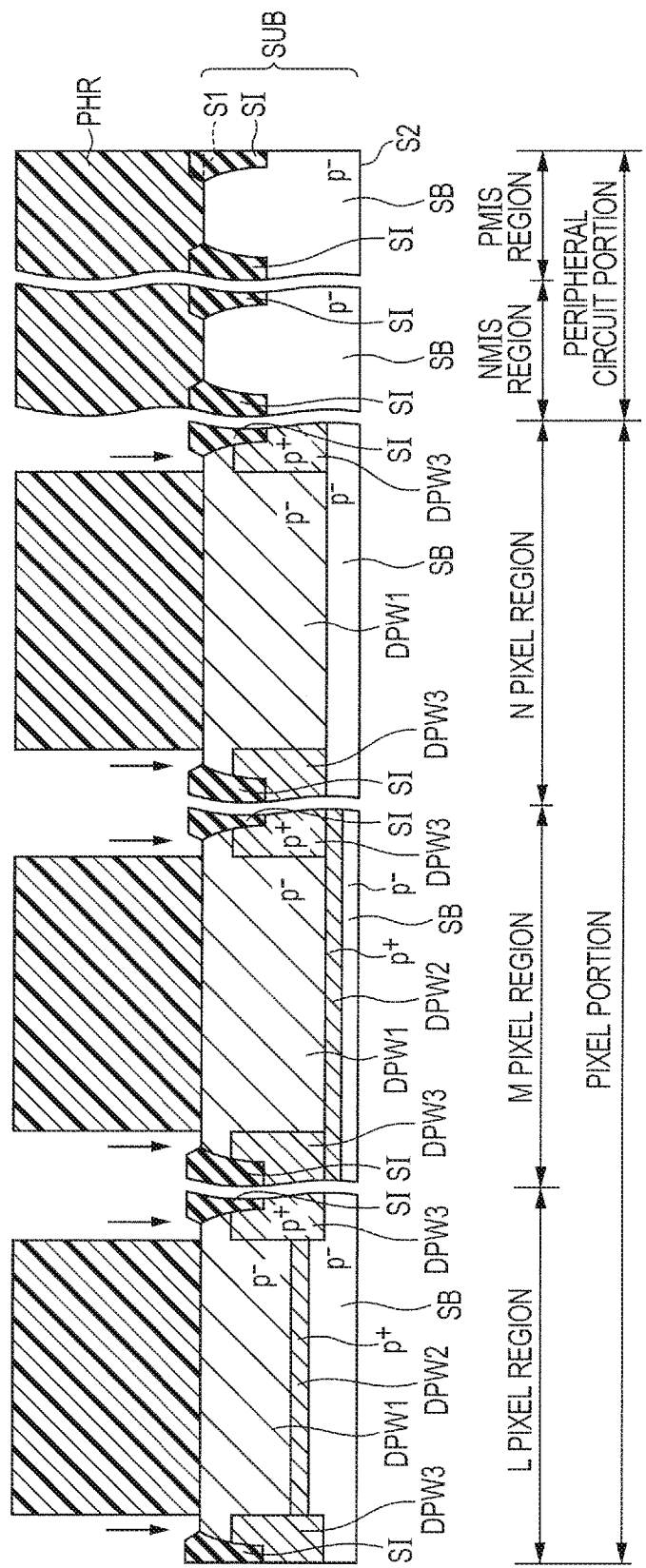
FIG. 11 is a schematic cross-sectional view showing a seventh step of the manufacturing method of the semiconductor device of First Embodiment.

As FIG. 11 shows, after removal of the photoresist PHR of FIG. 10 by ashing or the like, a photoresist PHR is applied again onto a substantial entirety of the main surface S1 of the semiconductor substrate SUB and by typical photolithography, an opening of the photoresist PHR is formed at a boundary between one of the pixel regions and another pixel region adjacent thereto. Under such a state, p type impurity ions are implanted from above the main surface S1 into the main surface S1 between two pixel regions of the L, M, and N pixel regions by typical ion implantation. A p-type well DPW3 located in the pixel boundary region is thereby formed immediately below a formation region of an element isolation insulating film SI. During ion implantation, impurity ions may be implanted from a direction substantially perpendicular to the main surface S1. The p-type well DPW3 located in the pixel boundary region may, for example, overlap with the element isolation insulating film SI in plan view.

Figure 12:
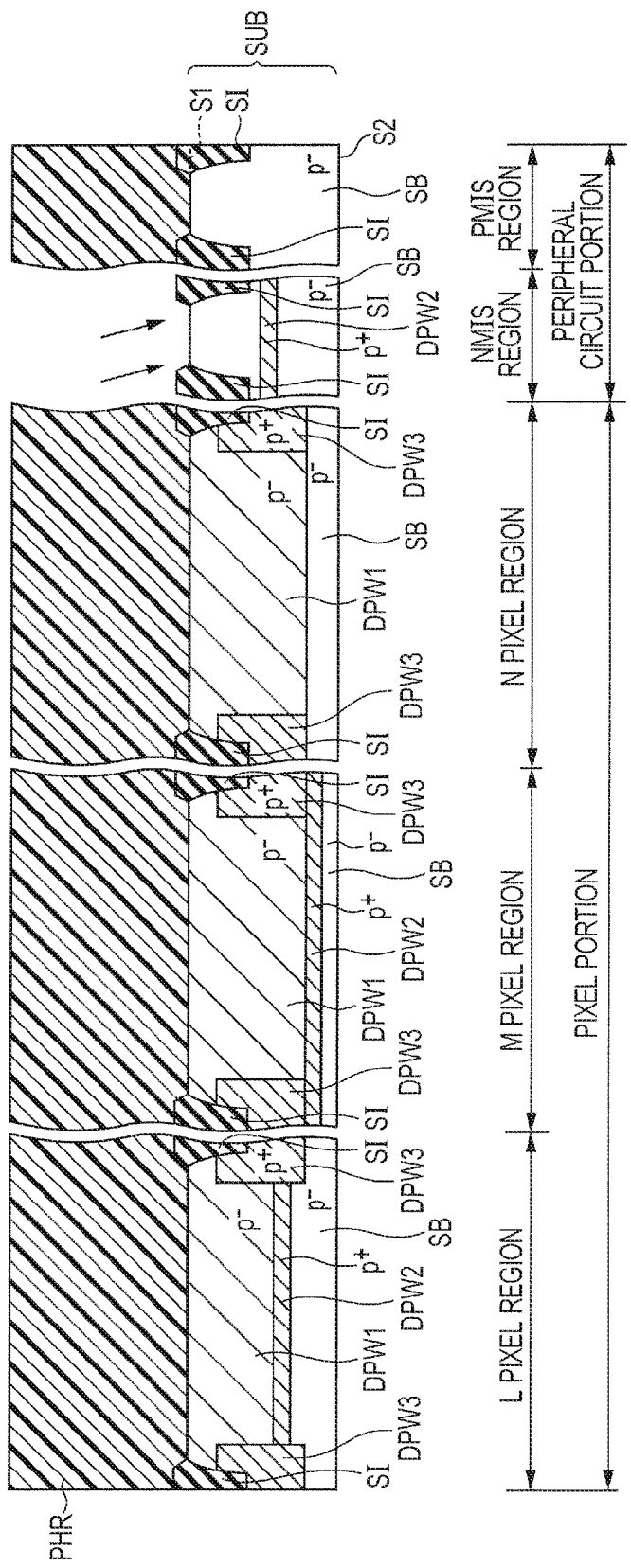
FIG. 12 is a schematic cross-sectional view showing an eighth step of the manufacturing method of the semiconductor device of First Embodiment.

As FIG. 12 shows, a pattern of a photoresist PHR having an opening in a region to be an NMIS region of the peripheral circuit portion is formed by typical photolithography similarly to that described above. By the typical ion implantation from above the main surface S1, a buried p type well region DPW2 is formed in the p⁻ region SB in a region to be an NMIS region.

Figure 13:
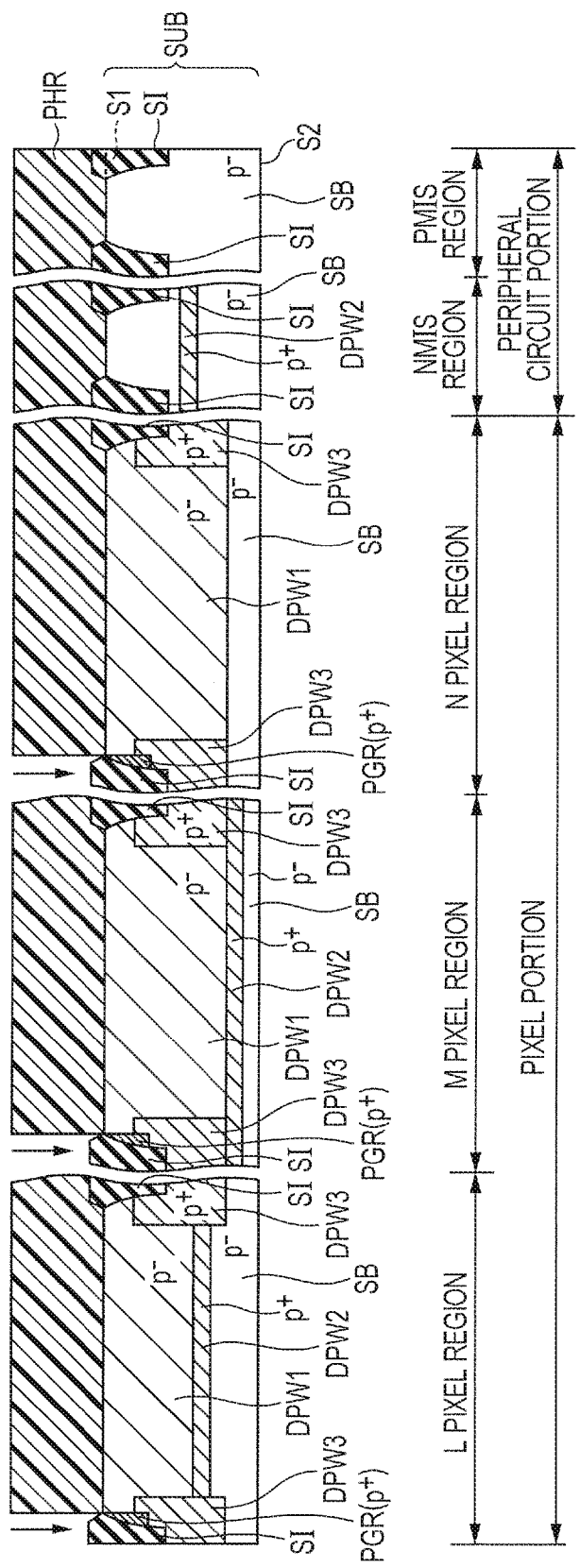
FIG. 13 is a schematic cross-sectional view showing a ninth step of the manufacturing method of the semiconductor device of First Embodiment.

As FIG. 13 shows, a p type guard ring region PGR is formed by typical photolithography and ion implantation on the lateral portion, on the right side in the drawing, of the element isolation insulating film SI located in the pixel portion.

Figure 14:
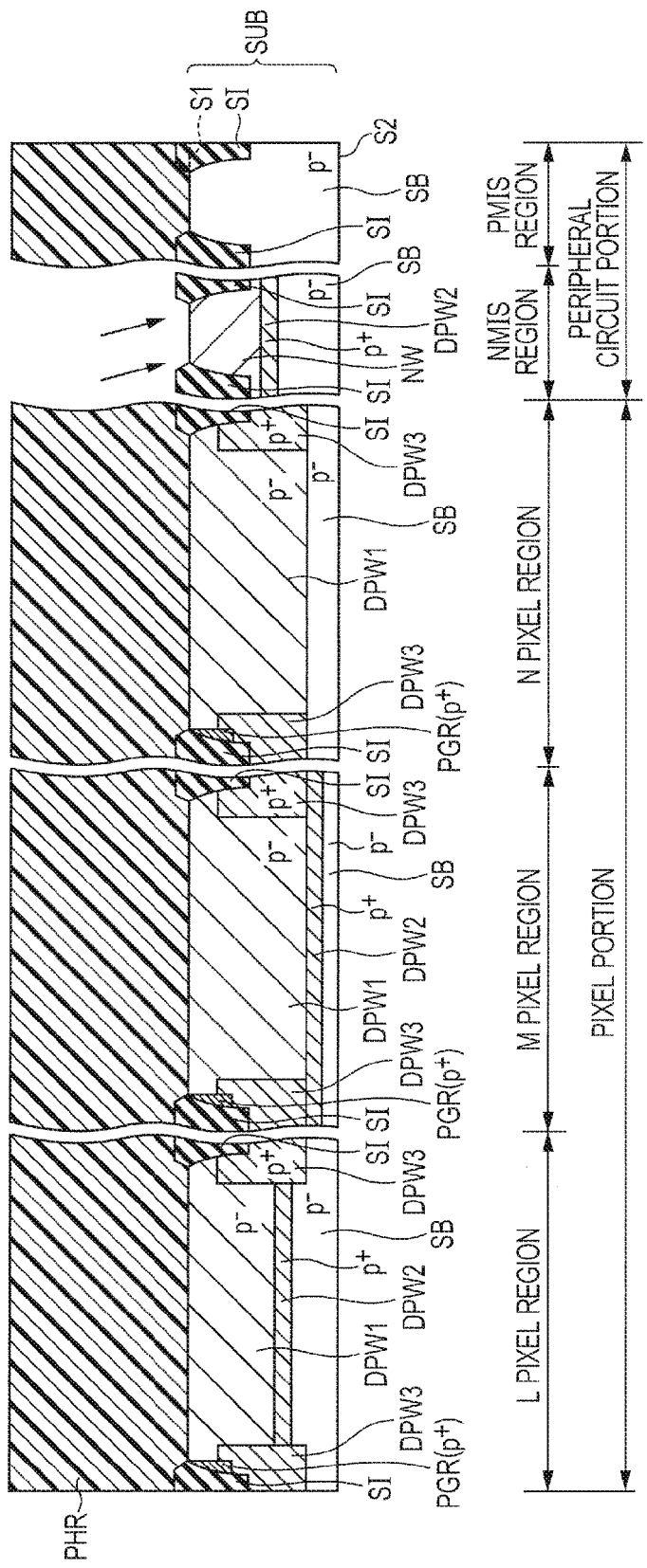
FIG. 14 is a schematic cross-sectional view showing a tenth step of the manufacturing method of the semiconductor device of First Embodiment.

As FIG. 14 shows, n type impurity ions are implanted into the p⁻ region SB of the region to be an NMIS region from above the main surface S1 by typical photolithography and ion implantation and an n type well region NW is formed which extends from the main surface S1 to the uppermost surface of the buried p type well region DPW.

In FIG. 14, then type well region NW has a depth, from the main surface S1 to the lowermost portion most distant therefrom, shallower than, for example, that of the p type well region DPW1 of the M pixel region and the N pixel region. The depth is not limited to such an aspect but the depth of the n type well region NW from the main surface S1 of the semiconductor substrate SUB to the lowermost portion most distant therefrom is arbitrary.

Figure 15:
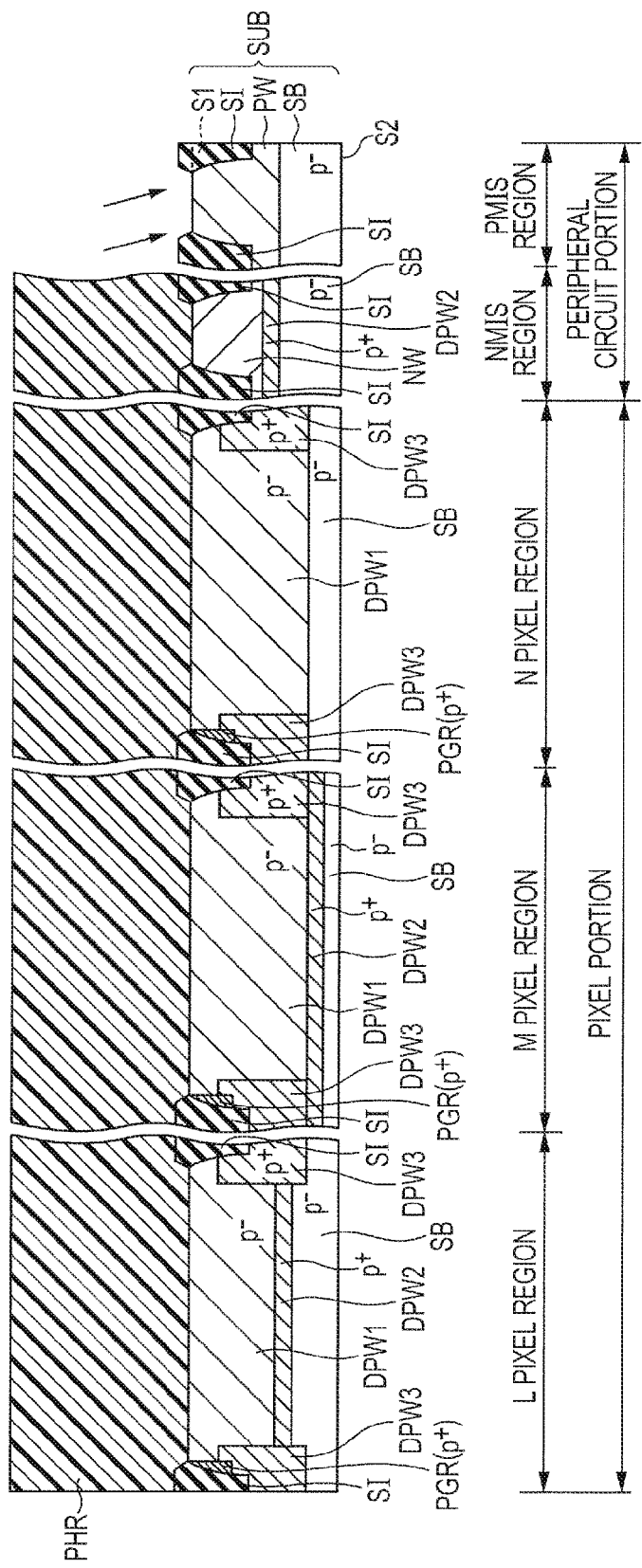
FIG. 15 is a schematic cross-sectional view showing an eleventh step of the manufacturing method of the semiconductor device of First Embodiment.

As FIG. 15 shows, p type impurity ions are implanted from above the main surface S1 into the p⁻ region SB in a region to be a PMIS region by typical photolithography and ion implantation and a p type well region PW is formed which extends from the main surface S1 to a depth substantially equal to, for example, the lowermost portion of the buried p type well region DPW2 of the NMIS region. The depth of the p type well region PW from the main surface S1 of the semiconductor substrate SUB to the lowermost portion most distant therefrom is however not limited.

Figure 16:
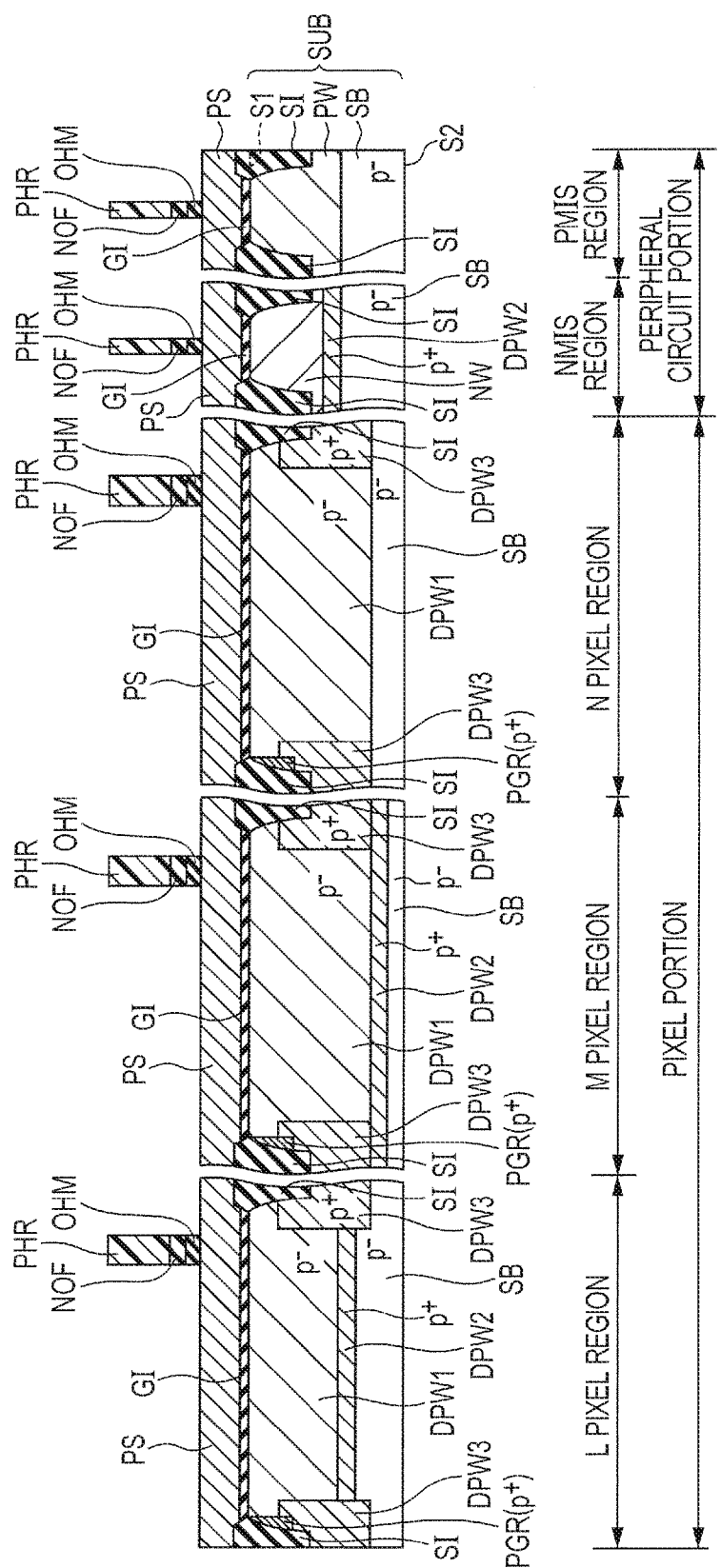
FIG. 16 is a schematic cross-sectional view showing a twelfth step of the manufacturing method of the semiconductor device of First Embodiment.

As FIG. 16 shows, after removal of the photoresist PHR of FIG. 15, a gate insulating film GI and a polycrystalline silicon film PS are stacked one after another in order of mention on a substantial entirety of the main surface S1 of the semiconductor substrate SUB. As the gate insulating film GI, for example, a silicon oxide film is formed preferably, for example, by thermal oxidation treatment. The polycrystalline silicon film PS is formed on the upper surface of the gate insulating film GI preferably, for example, by CVD.

Next, for example, a silicon oxide film and a silicon oxynitride film are stacked one after another in order of mention on the upper surface of the polycrystalline silicon film PS and a photoresist PHR is then applied to the stacked film. By typical photolithography and etching with the photoresist PHR, the silicon oxide film and the silicon oxynitride film are patterned so as to leave them in a formation region of a gate electrode of a transfer transistor in a region to be each pixel region of the pixel portion and a formation region of a gate electrode of the MIS transistor of the peripheral circuit portion. The above-mentioned silicon oxide film is thereby formed as a hard mask OHM made of oxide film and the silicon oxynitride film immediately thereunder is formed as the silicon oxynitride film NOF serving as an anti-reflective film.

Figure 17:
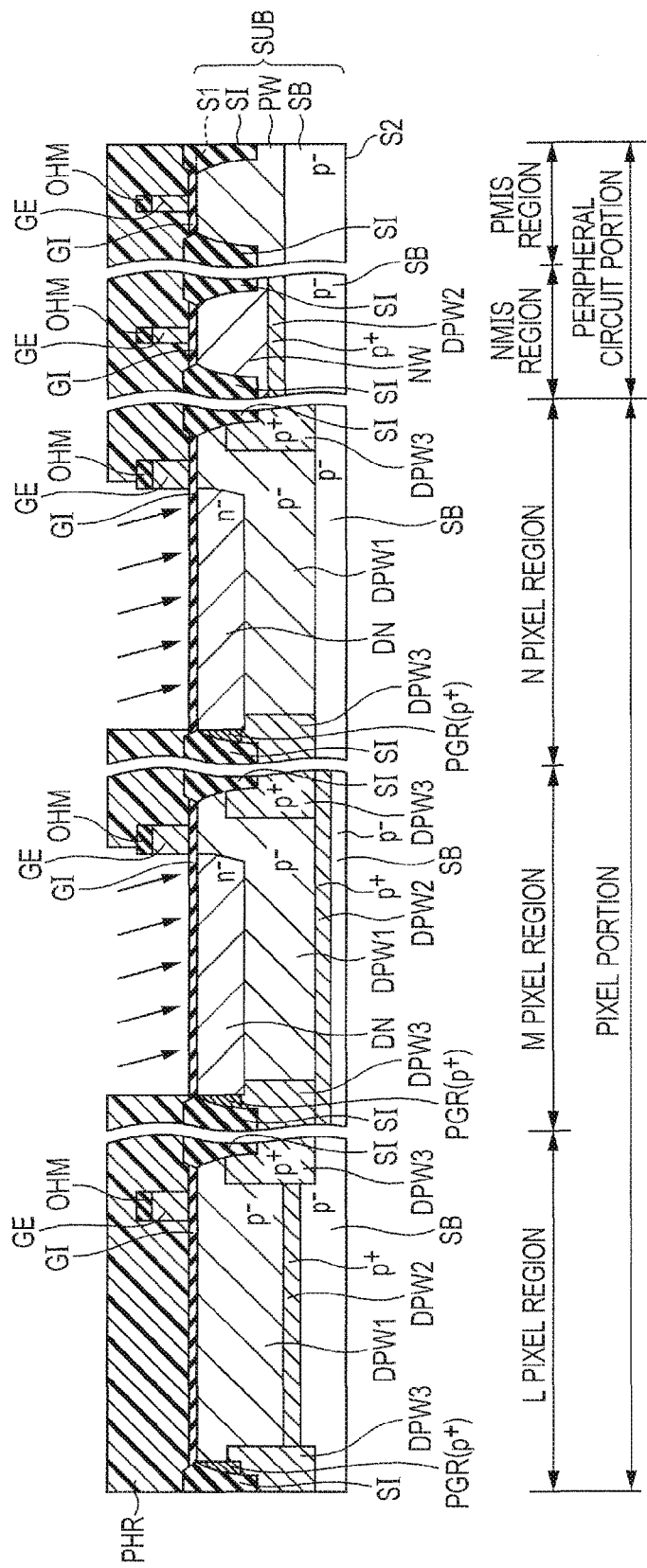
FIG. 17 is a schematic cross-sectional view showing a thirteenth step of the manufacturing method of the semiconductor device of First Embodiment.

As FIG. 17 shows, after removal of the photoresist PHR and the silicon oxynitride film NOF of FIG. 16, the polycrystalline silicon film PS is etched to leave it immediately under the hard mask OHM made of oxide film by typical etching with the hard mask OHM made of oxide film as a mask. The polycrystalline silicon film PS is thereby formed as a gate electrode GE of each region.

Next, a pattern of a photoresist PHR having an opening immediately above regions in which photodiodes of the M pixel region and the N pixel region are to be formed, respectively, is formed on the main surface S1 of the semiconductor substrate SUB and n type impurity ions are implanted by typical ion implantation to form an n type region DN in the main surface S1 in the p type well region DPW1 of each of the M pixel region and N pixel region. Since the n type region DN has the lowermost portion, most distant from the main surface S1, at a position shallower than the lowermost portion of the p type well region DPW1, the lowermost portion of the n type region DN is formed in the p type well region DPW1. The lowermost portion of the n type region DN and the p type well region DPW1 therefore configures a pn junction therebetween. The perpendicular thickness of the n type region DN in the drawing is more preferably not more than half of the perpendicular thickness of the p type well region DPW1 (in any of the L, M, and N pixel regions).

Figure 18:
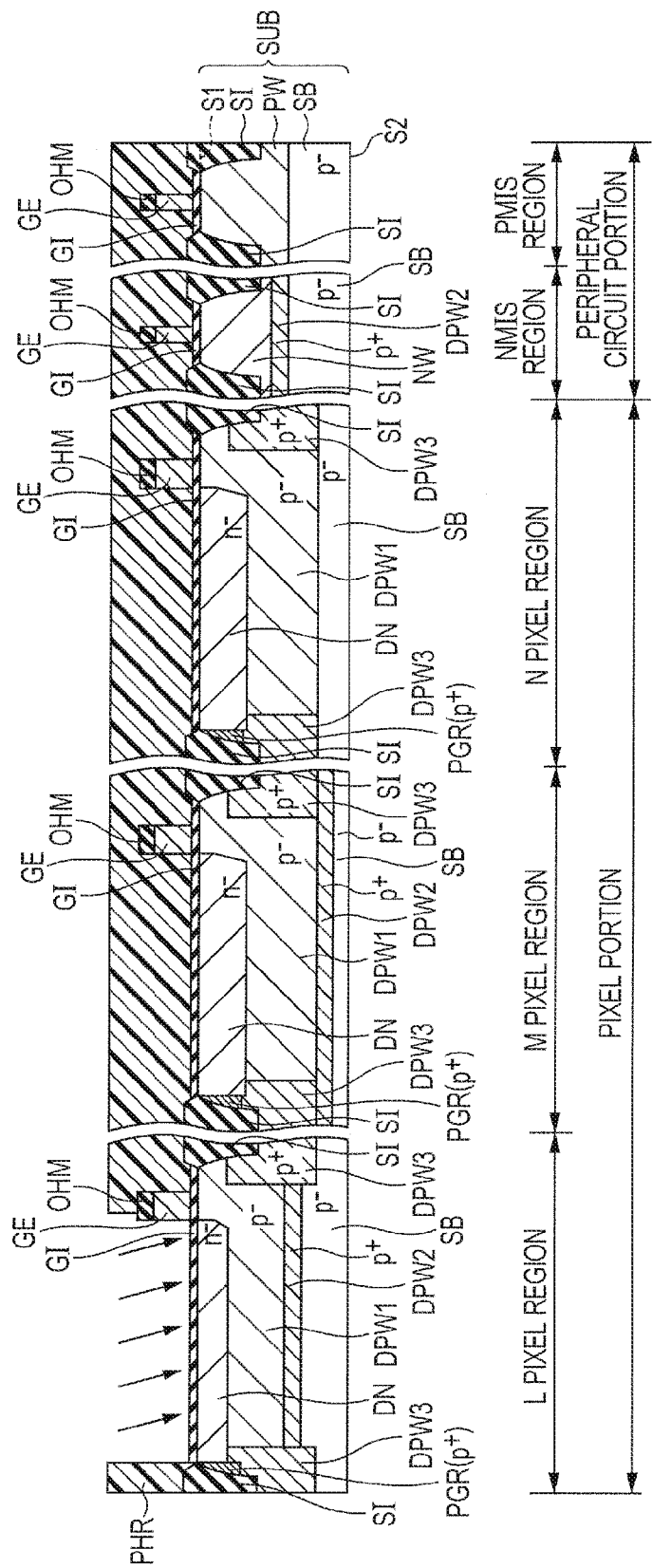
FIG. 18 is a schematic cross-sectional view showing a fourteenth step of the manufacturing method of the semiconductor device of First Embodiment.

As FIG. 18 shows, n type impurity ions are implanted on the main surface S1 by typical photolithography and ion implantation to form an n type region DN in the main surface S1 in the p type well region DPW1 of the L pixel region.

The n type region DN in the L pixel region is preferably thinner than the n type region DN in the M pixel region and the N pixel region. This means that the n type region DN in the L pixel region has preferably a thickness, in the perpendicular direction in the drawing, smaller than that of then type region DN in the M pixel region and the N pixel region. Further, this means that when then type region DN in the L pixel region and the n type region DN in the M and N pixel regions are each formed in the main surface S1, the lowermost portion of then type region DN in the L pixel region, which portion is most distant from the main surface S1, is preferably closer to the main surface S1 (or is shallower) than the lowermost portion of the n type region DN in the M and N pixel regions which portion is most distant from the main surface S1.

Figure 19:
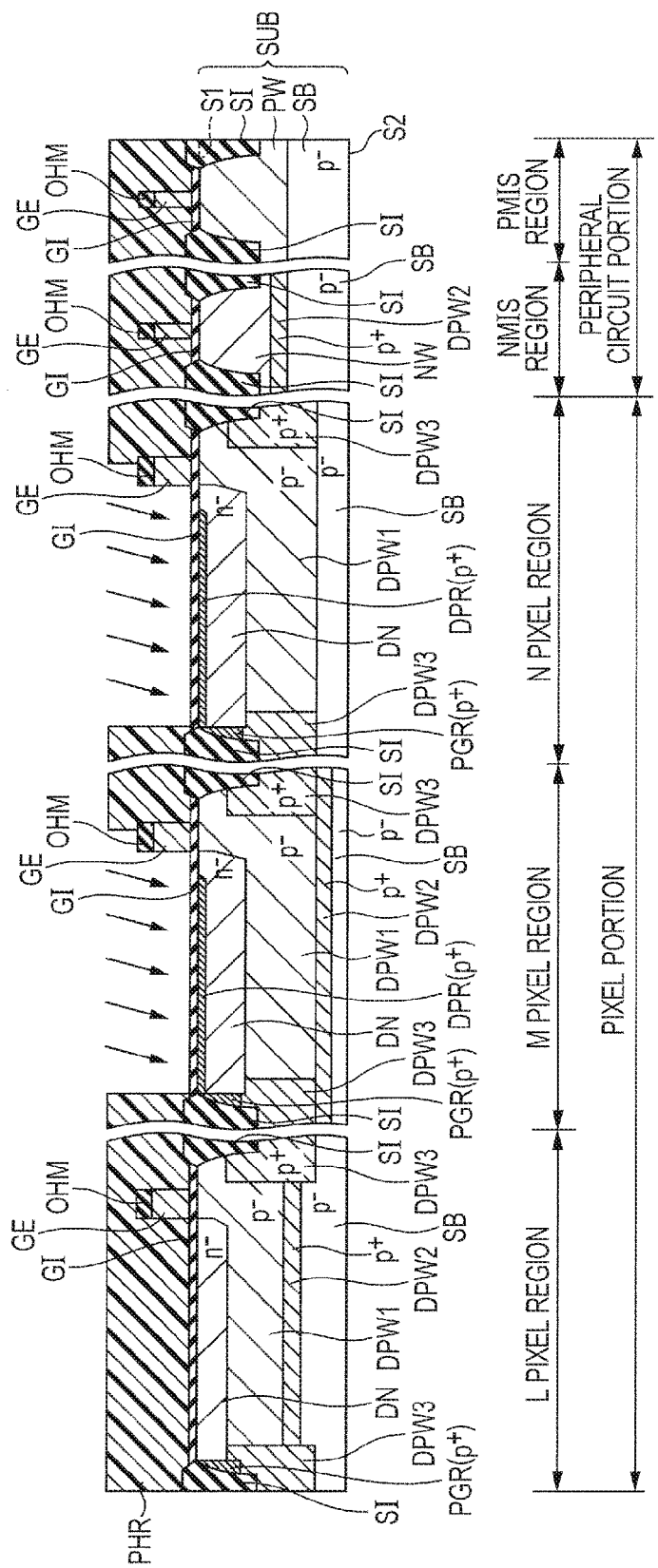
FIG. 19 is a schematic cross-sectional view showing a fifteenth step of the manufacturing method of the semiconductor device of First Embodiment.

As FIG. 19 shows, a p type region DPR is formed in the main surface S1 in the n type region DN of each of the regions to be an M pixel region and an N pixel region, respectively, by typical photolithography and ion implantation. In the step of FIG. 17, n type impurity ions are preferably implanted obliquely in a direction slightly descending from the upper left to the lower right relative to the perpendicular direction to the main surface S1. In the step of FIG. 19, on the contrary, p type impurity ions are preferably implanted obliquely in a direction descending from the upper right to the lower left relative to a direction perpendicular to the main surface S1. The width, in the horizontal direction in the drawing, of the p type region DPR may be slightly narrower than the width of the n type region DN in the horizontal direction in the drawing.

The lowermost portion, most distant from the main surface S1, of the p type region DPR is formed at a position shallower than the lowermost portion of the n type region DN so that the lowermost portion of the p type region DPR is preferably formed in the n type region DN.

Figure 20:
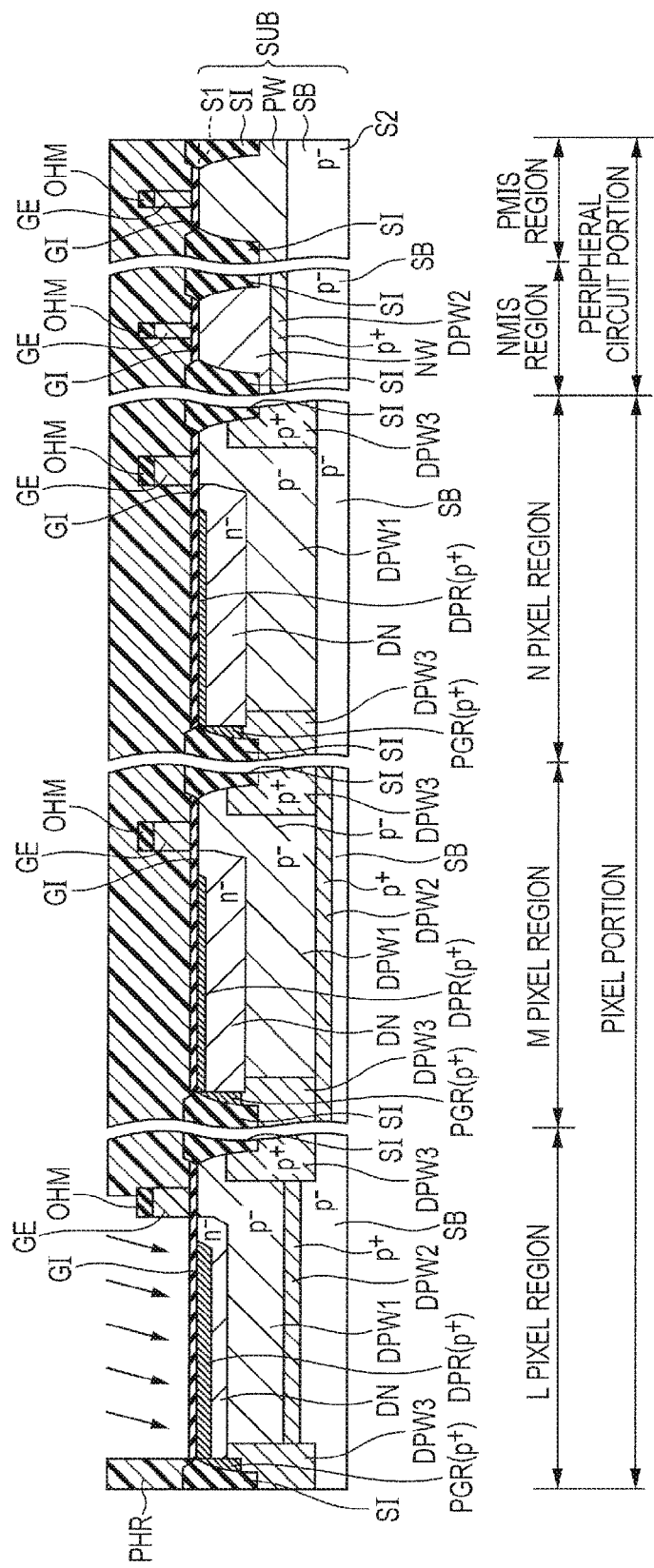
FIG. 20 is a schematic cross-sectional view showing a sixteenth step of the manufacturing method of the semiconductor device of First Embodiment.

As FIG. 20 shows, p type impurity ions are implanted by typical photolithography and ion implantation to form a p type region DPR in the main surface S1 in the n type region DN in the region to be an L pixel region.

The p type region DPR in the L pixel region is preferably thicker, in the perpendicular direction in the drawing, than the p type region DPR in the M pixel region and N pixel region. In other words, when the p type region DPR of each of the L, M, and N pixel regions is formed in the main surface S1, the lowermost portion of the p type region DPR in the L pixel region, which portion is most distant from the main surface S1, is formed preferably in a region deeper from the main surface S1 than the lowermost portion of the p type region DPR in each of the M and N pixel regions which portion is most distant from the main surface S1.

Also in the step of FIG. 20, similar to the step of FIG. 19, p type impurity ions are preferably implanted so as to incline in a direction slightly descending from the upper right to the lower left relative to a direction perpendicular to the main surface S1.

Figure 21:
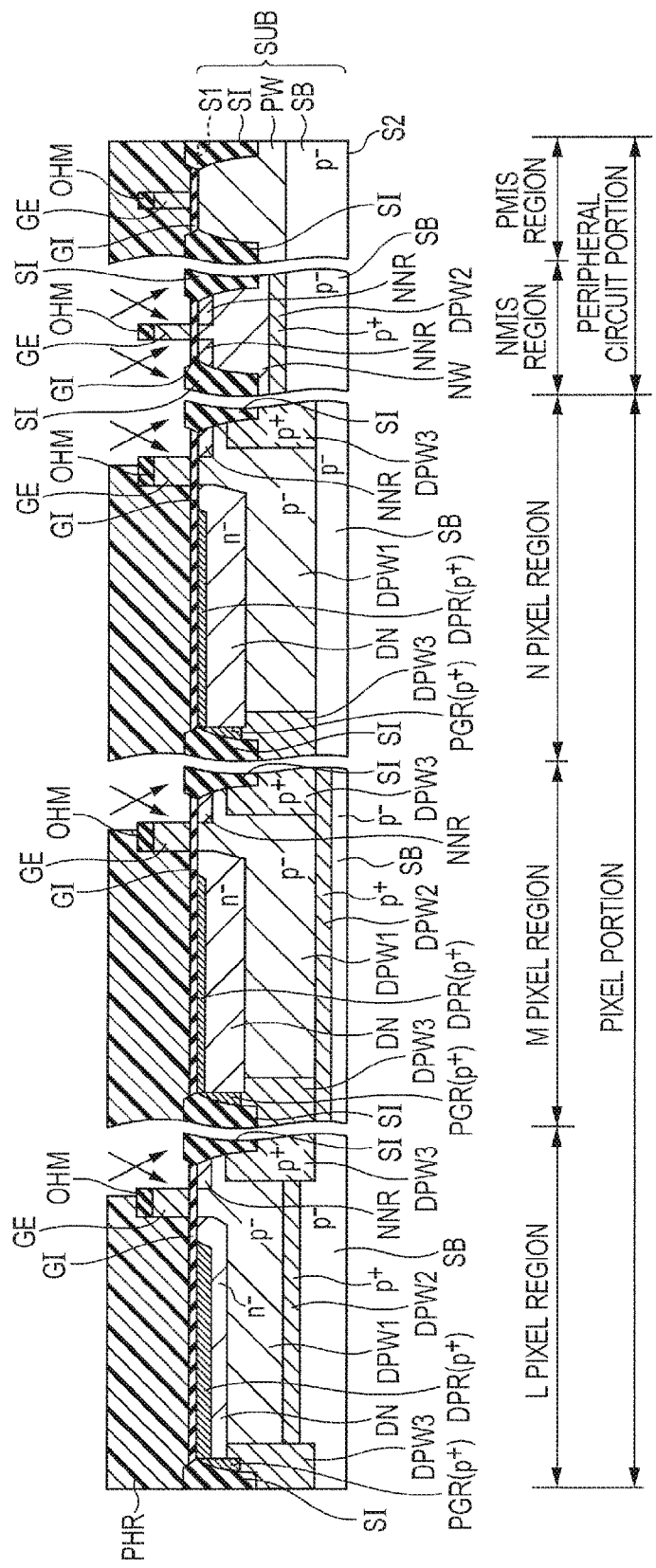
FIG. 21 is a schematic cross-sectional view showing a seventeenth step of the manufacturing method of the semiconductor device of First Embodiment.

As FIG. 21 shows, a lightly doped n type impurity region NNR to be LDD is formed in the main surface S1 of the semiconductor substrate SUB in the p type well region DPW1 and the n type well region NW by typical photolithography and ion implantation.

Figure 22:
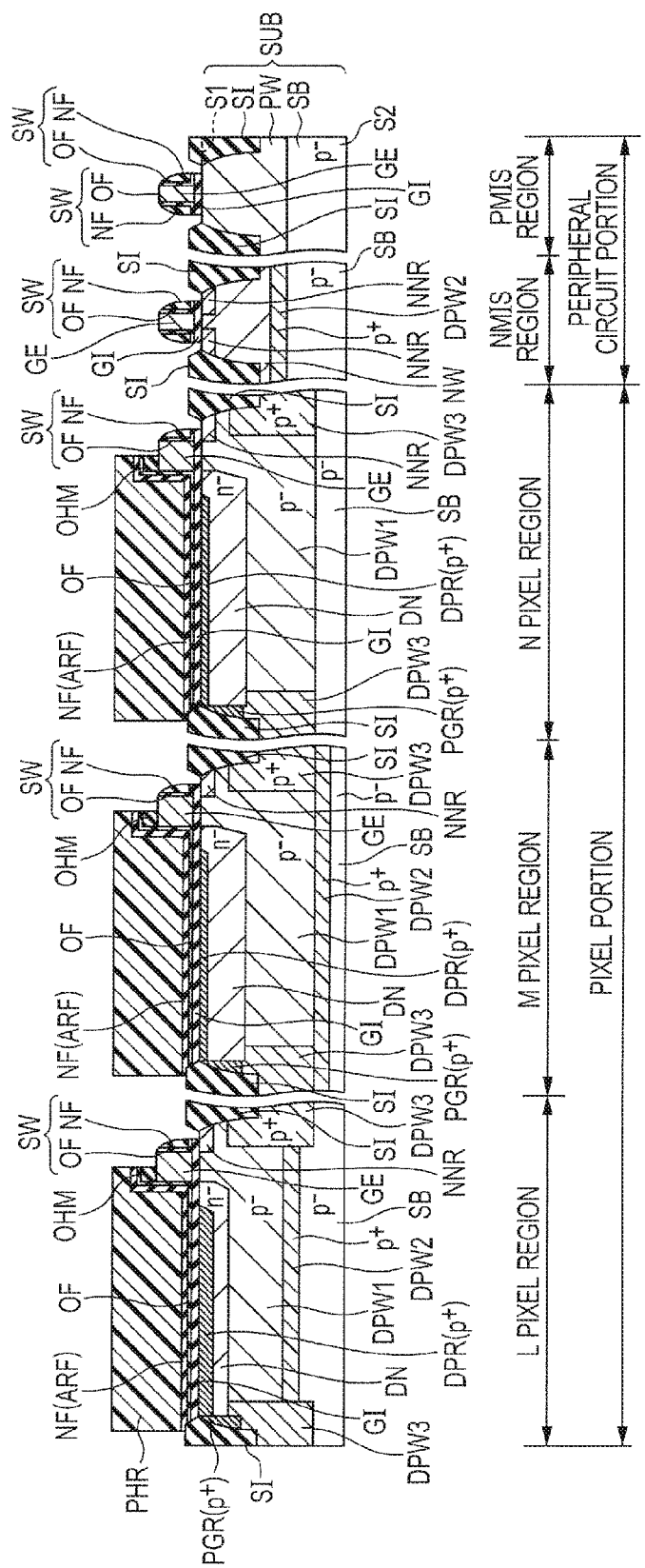
FIG. 22 is a schematic cross-sectional view showing an eighteenth step of the manufacturing method of the semiconductor device of First Embodiment.

As FIG. 22 shows, for example, a silicon oxide film OF and a silicon nitride film NF are stacked one after another in the order of mention and thus deposited on the entirety of the surface of the semiconductor substrate SUB. Then, by photolithography and etching, the silicon oxide film OF and the silicon nitride film NF are patterned so as to cover therewith at least the upper portion of the photodiode to form a silicon oxide film OF and a silicon nitride film NF as an anti-reflective film.

As shown in the drawing, the hard mask OHM made of oxide film may be partially etched off.

Figure 23:
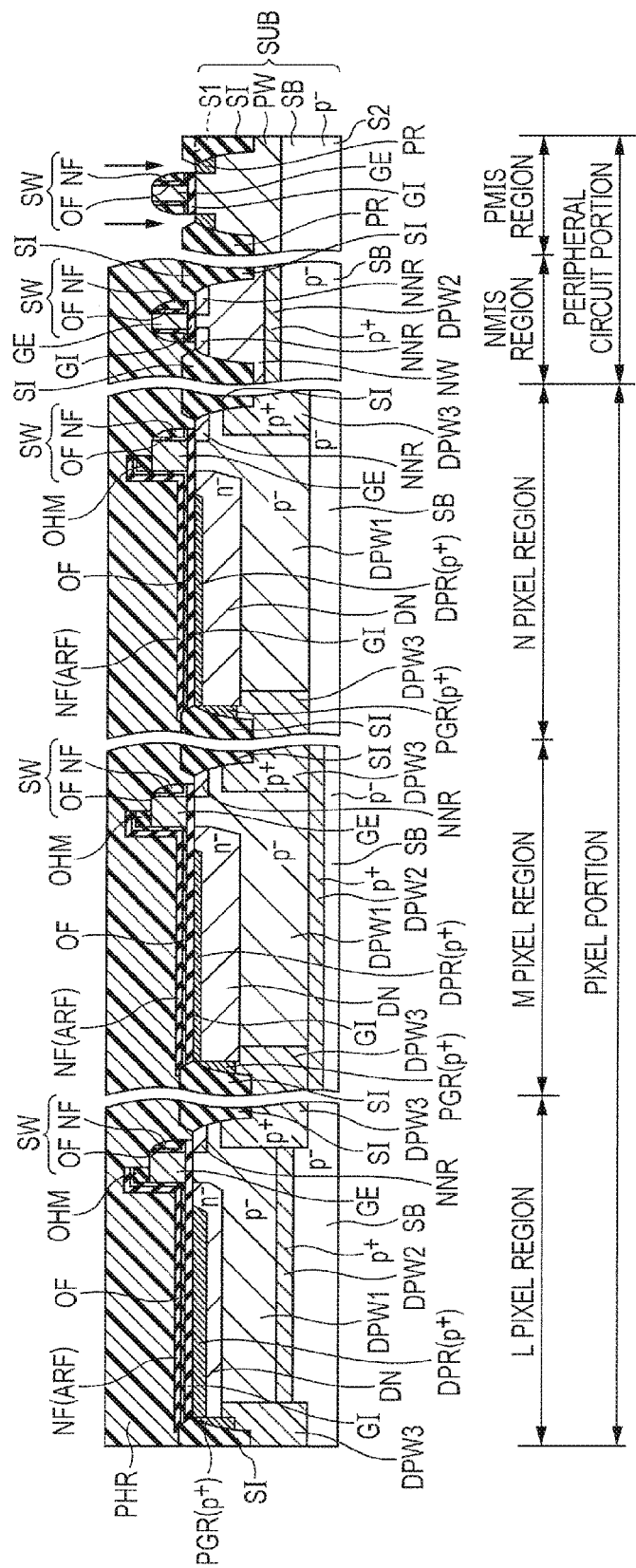
FIG. 23 is a schematic cross-sectional view showing a nineteenth step of the manufacturing method of the semiconductor device of First Embodiment.

As FIG. 23 shows, a p type impurity region PR as a source/drain region of a p type MIS transistor in the PMIS region is formed in the main surface S1 of the p type well region PW in the PMIS region by typical photolithography and ion implantation.

Figure 24:
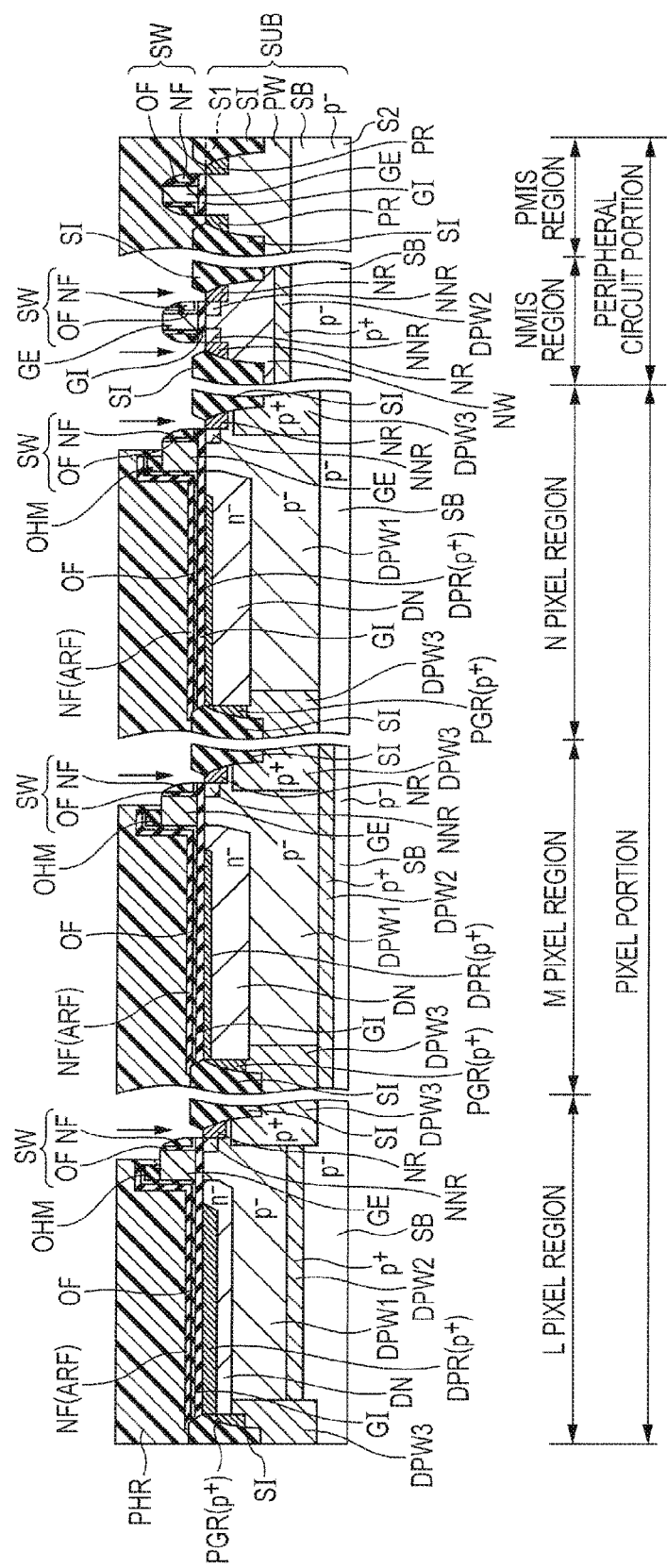
FIG. 24 is a schematic cross-sectional view showing a twentieth step of the manufacturing method of the semiconductor device of First Embodiment.

As FIG. 24 shows, an n type impurity region NR is formed in a predetermined region of the main surface S1 in the p type well region DPW1 and the n type well region NW by typical photolithography and ion implantation.

Figure 25:
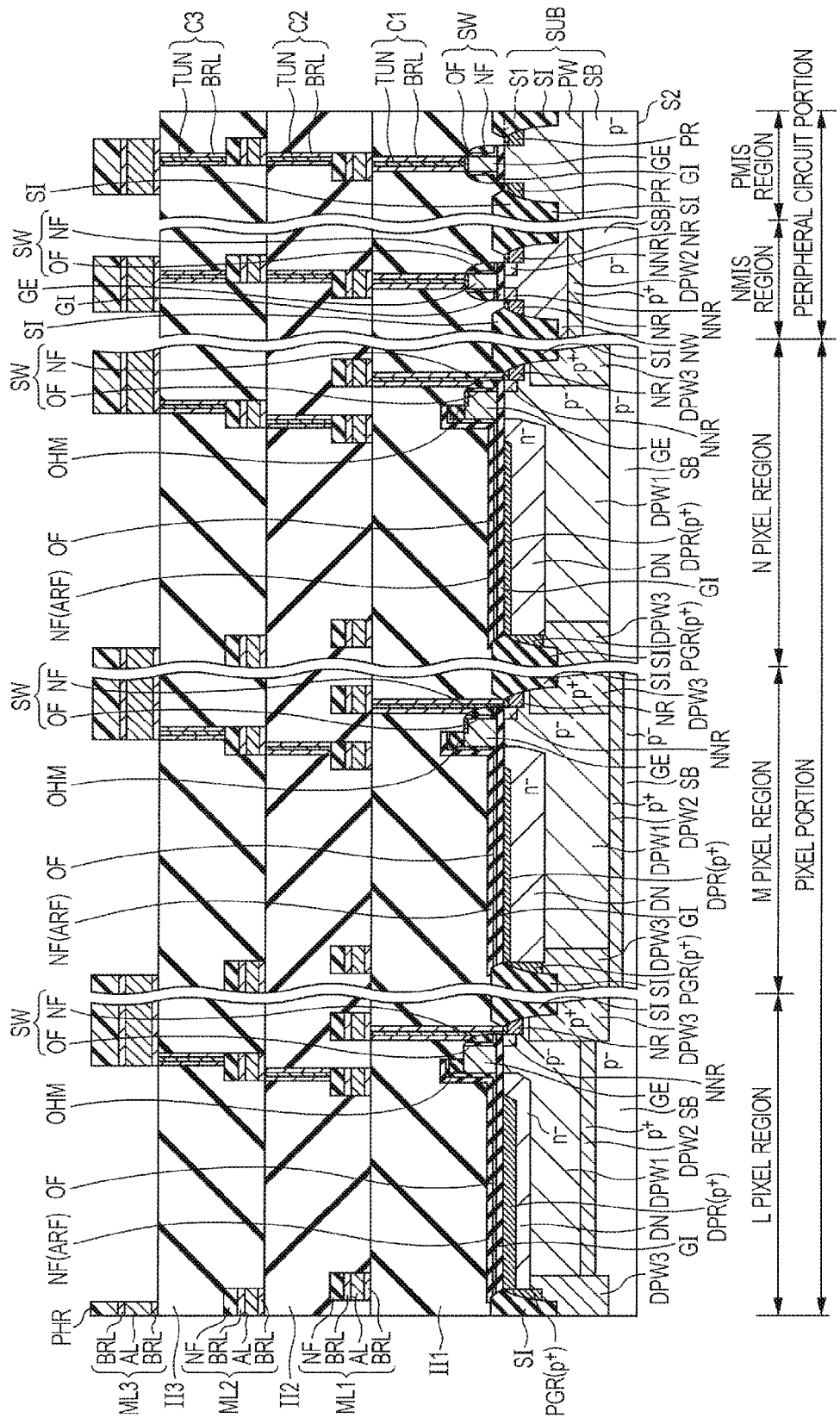
FIG. 25 is a schematic cross-sectional view showing a twenty-first step of the manufacturing method of the semiconductor device of First Embodiment.

As FIG. 25 shows, an interlayer insulating film II1 made of a silicon oxide film is formed, for example, by CVD and the upper surface of the interlayer insulating film II1 is polished by CMP. A contact hole reaching the n type region NR or the gate electrode GE is formed by typical photolithography and etching and it is filled with a barrier metal layer BRL and a conductive layer TUN, for example, by typical sputtering to form a contact layer C1.

A thin stacked film obtained by typical sputtering and CVD is formed as a metal wiring ML1 having a configuration obtained by stacking a barrier metal layer BRL, an aluminum layer AL, a barrier metal layer BRL, and a silicon nitride film NF in order of mention by typical photolithography and etching.

An interlayer insulating film II2 is formed on the interlayer insulating film II1 so as to cover the upper surface of the metal wiring ML1. Treatment similar to that described above is next performed to form a contact layer C2 and a metal wiring ML2. An interlayer insulating film II3 is formed on the interlayer insulating film II2 so as to cover the upper surface of the metal wiring ML2. Treatment similar to that described above is next performed to form a contact layer C3 and a metal wiring ML3.

As described above, an interlayer insulating film II4 is then formed and in the end, a condenser lens LNS is installed immediately above the photodiode to form an image sensor shown in FIG. 4.

Figure 26:
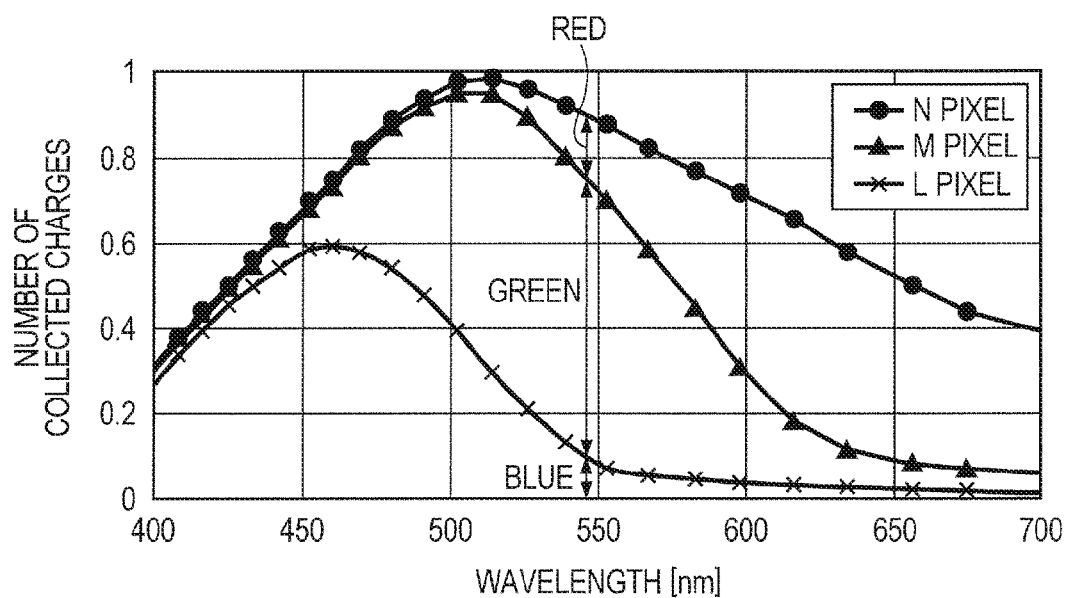
FIG. 26 is a graph showing the number of charges collected as a result of photoelectric conversion of a light of each wavelength in each pixel.

Next, referring to FIGS. 26 and 27, the advantageous effect of the present embodiment will next be described while describing the optical detection characteristics of the above-mentioned each pixel region As FIG. 26 shows, the wavelength of a light incident on an image sensor as the semiconductor device is plotted along the abscissa of this graph, while the number of charges generated through photoelectric conversion by the L pixel, M pixel, and N pixel which have received a light of the above-mentioned wavelength and collected by them is plotted as a relative value along the ordinate. As the L pixel, M pixel, and N pixel, selected are pixels adjacent to each other and contained in one pixel region comprised of totally four pixel regions arranged in 2 rows and 2 columns shown in FIG. 3.

The L pixel, M pixel, and N pixel each widely receive a visible light having a wavelength of 400 nm or more but not more than 700 nm and cause photoelectric conversion. The wavelength range of a light at which photoelectric conversion is likely to be caused however differs among the pixels.

More specifically, the L pixel receives a visible light (for example, blue visible light) having a wavelength as relatively low as about 450 nm or more but not more than 500 nm and thereby actively performs photoelectric conversion. The collected amount of charges generated by it is therefore large. The M pixel receives, in addition to the blue visible light, a visible light (for example, green visible light) having a middle wavelength, more specifically, about 500 nm or more but not more than 550 nm and thereby actively performs photoelectric conversion. The collected amount of charges generated by it is therefore large. The N pixel receives, in addition to the green visible light, a visible light (for example, red visible light) having a wavelength as long as 550 nm or more and thereby actively performs photoelectric conversion. The collected amount of charges generated by it is therefore large.

Figure 27:
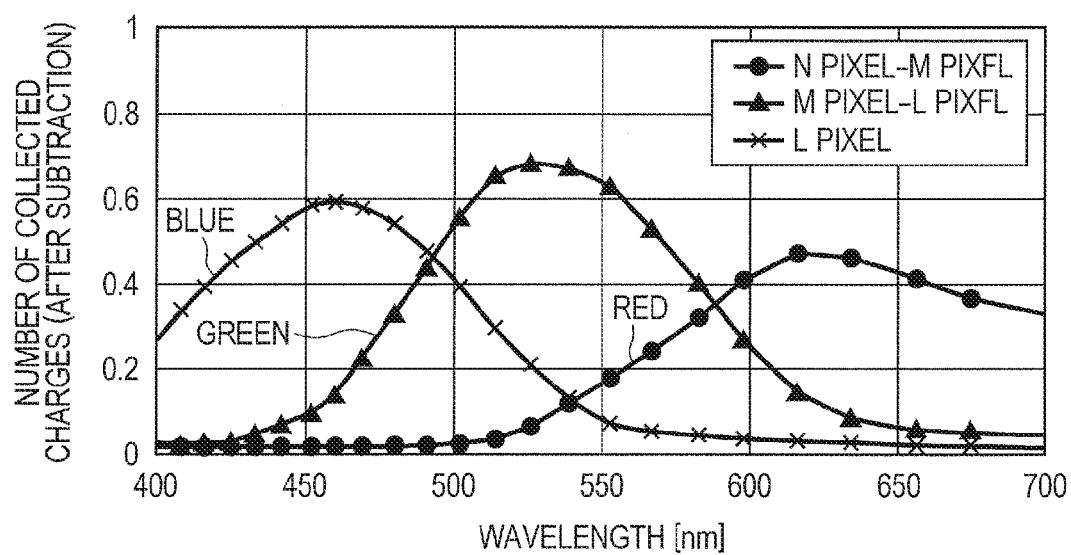
FIG. 27 is a graph showing the output of a light of each color obtained based on the data of the number of collected charges in a photo diode in each pixel in FIG. 26.

As FIG. 27 shows, the numerical value plotted along the abscissa of this graph is similar to that of the graph of FIG. 26, but plotted along the ordinate are, in addition to the number of charges collected by the L pixel similar to that shown in FIG. 26, an arithmetic result obtained from a difference obtained by subtracting the number of charges collected by the M pixel from the number of charges collected by the N pixel and a difference obtained by subtracting the number of charges collected by the L pixel from the number of charges collected by the M pixel.

The L pixel performs photoelectric conversion, receiving a blue light having a short wavelength so that the blue light receiving quantity in each unit pixel is detected approximately as a signal value itself obtained based on the first number of collected charges in a photo diode generated by photoelectric conversion of a short wavelength visible light received by the L pixel.

The M pixel performs photoelectric conversion, receiving a blue light having a short wavelength and a green light having a middle wavelength so that the middle wavelength visible light receiving quantity received by each unit pixel can be detected by subtracting, from a signal value obtained based on the second number of collected charges in a photo diode generated by photoelectric conversion by the M pixel, the above-mentioned signal value available based on the first number of collected charges in a photo diode of the L pixel adjacent to the M pixel. The M pixel and the L pixel adjacent thereto in the same unit pixel are presumed to receive almost the same short wavelength visible light so that the middle wavelength visible light receiving quantity, for example, a green light received by the M pixel can be approximately detected.

The N pixel performs photoelectric conversion, receiving a middle wavelength green visible light and a long-wavelength red light so that the long-wavelength light receiving quantity, for example, a red light received by the unit pixel can be detected by subtracting, from the signal value available based on the third number of collected charges in a photo diode by the photoelectric conversion of the N pixel, the above-mentioned signal value obtained based on the second number of collected charges in a photo diode generated by photoelectric conversion by the M pixel. The photoelectric conversion amount of a red light by the L element is negligibly small so that the amount can be determined approximately as described above from only the second and third numbers of collected charges while neglecting the amount in the L pixel.

Calculation as described above makes it possible to analyze the amount of an incident light by color in the image sensor of the present embodiment which does not use a color filter for separation of light into colors. The present embodiment does not require using of a color filter so that inconveniences such as reduction in the intensity of light or quality change under a high temperature environment which may otherwise occur by using a color filter can be eliminated.

The reason why the wavelength of a light which is likely to cause photoelectric conversion differs among pixels as shown in FIG. 26 is a difference in the configuration of each pixel. The p type well region DPW1 of the L pixel region lies at a position shallower than the p type well region DPW1 of the M pixel region and the N pixel region. The photodiode (particularly, n type region DN) of the L pixel therefore collects charges generated by photoelectric conversion which has occurred mainly in a relatively shallow region in the thickness direction.

The distance that a short wavelength visible light can travel in the semiconductor substrate SUB is smaller compared with a long-wavelength light so that photoelectric conversion occurs in a region relatively shallow from the main surface S1 and within a spreading range of a depletion layer due to a pn junction. Most of the charges generated by the pn junction between the p type well region DPW1 and the n type region DN formed in a relatively shallow region from the main surface S1 are likely to be derived from a short wavelength visible light.

The p type well region DPW1 has, on the main surface S2 side thereof, the buried p type well region DPW2 contiguous to the p type well region DPW1. Since the buried p type well region DPW2 has a p type impurity concentration higher than that of the p type well region DPW1 and the p⁻ region SB, the buried p type well region DPW2 becomes a barrier for charges obtained by photoelectric conversion. Assuming that charges are generated by photoelectric conversion in a region deeper than (on the side of the main surface S2) the buried p type well region DPW2 in the L pixel region, these charges are prevented from moving to the side of the main surface S1 by the buried p type well region DPW2 and have difficulty in reaching a charge collecting region such as the n type region DN.

The L pixel therefore mainly collects charges derived from a short wavelength visible light and has difficulty in collecting charges derived from a long-wavelength light which is likely to penetrate deeply in the semiconductor substrate SUB.

Next, the M pixel region also has the buried p type well region DPW2 therein so that similar to the L pixel, the M pixel is suppressed from collecting charges generated in a deep region of the p⁻ region SB and thereby suppressed from collecting charges derived from a long-wavelength light. The p type well region DPW1 of the M pixel has the lowermost portion deeper than that of the p type well region DPW1 of the L pixel so that the buried p type well region DPW2 contiguous to the p type well region DPW1 of the M pixel lies at a position deeper than that of the buried p type well region DPW2 of the L pixel. This facilitates the M pixel to collect charges derived from a light (middle wavelength green light) which has penetrated deeply, compared with the L pixel.

The N pixel collects charges generated by photoelectric conversion of a longer-wavelength red light than the M pixel collects so that collection of charges generated in a deeper region in the semiconductor substrate SUB is not disturbed. More specifically, the N pixel region is not equipped with the buried p type well region DPW2. This enables the N pixel to collect charges derived from a long-wavelength light which has penetrated in the p⁻ region SB on the side of the main surface S2 of the p type well region DPW1.

Next, in the present embodiment, any adjacent two (for example, in the row direction and the column direction configuring a matrix form) of the L pixel region, M pixel region, and N pixel region have, in the main surface S1 therebetween, the p-type well DPW3 located in the pixel boundary region. The p-type well DPW3 located in the pixel boundary region has a p type impurity concentration higher than that of the p type region therearound and it functions, similar to the buried p type well region DPW2, as a bather disturbing the progress of charges. The p-type well DPW3 located in the pixel boundary region can therefore prevent charges from entering between two or more pixels adjacent to each other.

For example, when charges generated by the L pixel in the L pixel region enter the M pixel region adjacent thereto, the L pixel cannot collect charges which it should collect and the M pixel collect charges which it should not collect. As a result, an error in signal value due to these charges and then, an error in the detection light receiving quantity occur, which may deteriorate the image quality.

When electrons are used as charges to be collected by a photodiode (n type region DN), the semiconductor substrate SUB having therein the p⁻ region SB (p type impurity) as in the present embodiment facilitates transfer of charges (electrons) generated in the p⁻ region SB to a pixel region adjacent thereto. For example, when the semiconductor substrate SUB contains an n type impurity, on the other hand, charges (electrons) generated in the substrate stay in the substrate and are hardly collected in then type region DN. This makes it difficult to detect an amount of charges obtained by photoelectric conversion.

As in the present embodiment, forming the semiconductor substrate SUB as a p type one (containing the p⁻ region SB)

and providing a p-type well DPW3 located in the pixel boundary region in a region between two pixel regions adjacent to each other make it possible to prevent charges from entering the adjacent pixel and allow a pixel which should collect charges to surely collect the charges.

Next, in the present embodiment, a middle wavelength (green) visible light is detected by subtracting a signal value of the first number of collected charges in a photo diode of the L pixel from the signal value of the second number of collected charges in a photo diode of the M pixel. If the detection sensitivity of the L pixel is excessively high, there is a possibility that the signal value of the first number of collected charges in a photo diode becomes large and the detection amount of the middle wavelength visible light decreases. The L pixel collects charges generated particularly in a shallow region near the main surface S1 so that the p type region DPR is preferably thinned in order to enhance the collection sensitivity.

From the standpoint of suppressing the detection sensitivity of the L pixel from exceeding the detection sensitivity of the M pixel, the p type region DPR of the L pixel region is made thicker than the p type region DPR of the M or N pixel region in the present embodiment. Similarly, the n type region DN of the L pixel region is made thinner than then type region DN of the M or N pixel region in order to suppress the detection sensitivity of the L pixel from exceeding the detection sensitivity of the M pixel.

Second Embodiment

Figure 28:
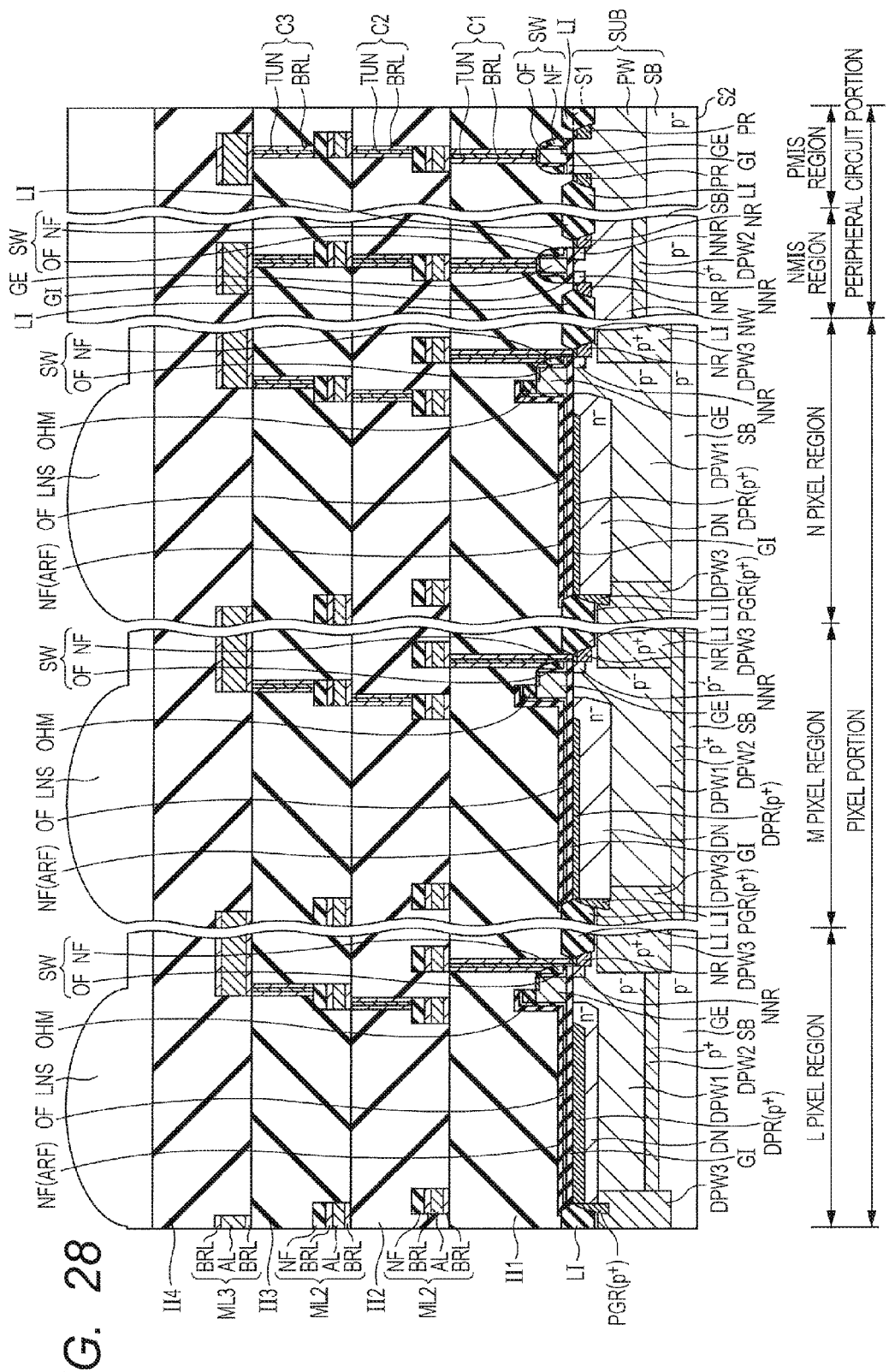
FIG. 28 is a schematic cross-sectional view showing the configuration of a semiconductor device of Second Embodiment in the region A encircled with the dotted line in FIG. 2.

As FIG. 28 shows, the present embodiment uses an element isolation insulating film SI made of, for example, a silicon oxide film and formed by LOCOS (local oxidation of silicon) instead of the element isolation insulating film SI of First Embodiment formed by STI.

Second Embodiment is different from First Embodiment in the above-mentioned point, but the configuration of the present embodiment other than it is almost similar to that of First Embodiment. In FIG. 28, like elements are identified by like reference numerals and overlapping description is omitted. Also in the present embodiment, an advantageous effect basically similar to that of First Embodiment can be obtained.

Figure 5:
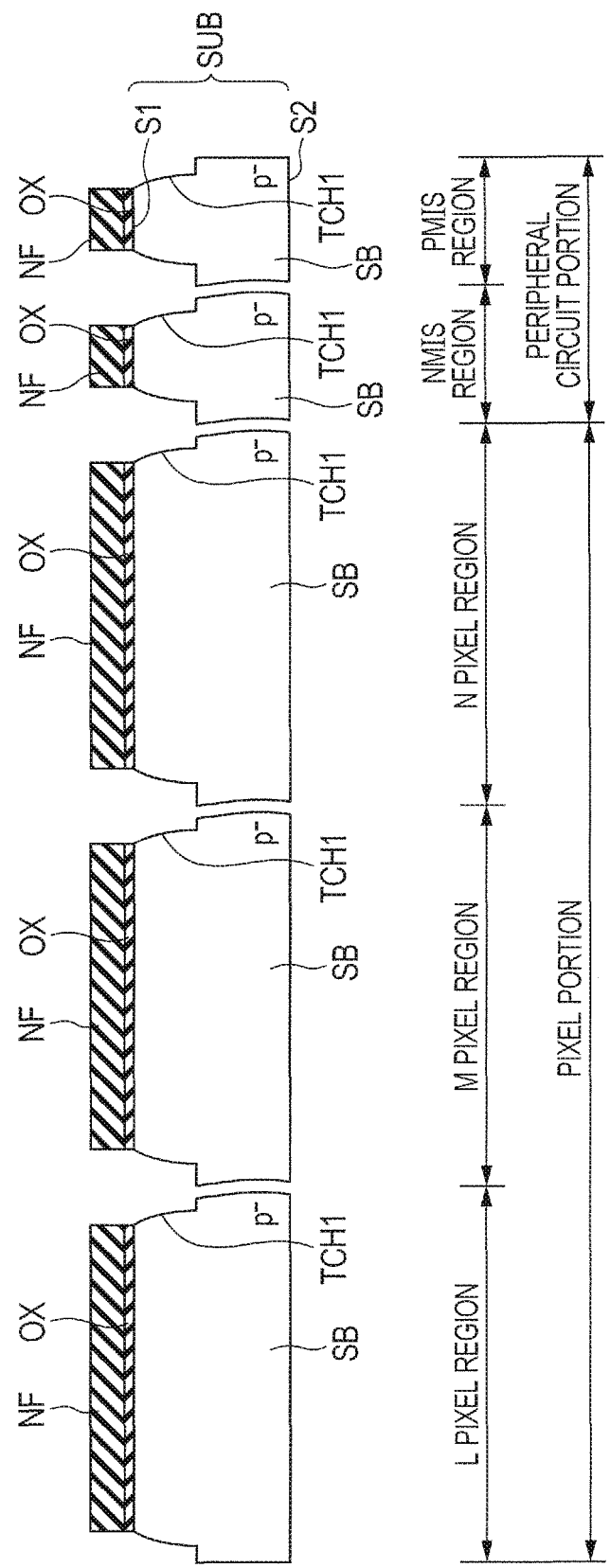
FIG. 5 is a schematic cross-sectional view showing a first step of a manufacturing method of the semiconductor device of First Embodiment.
Figure 29:
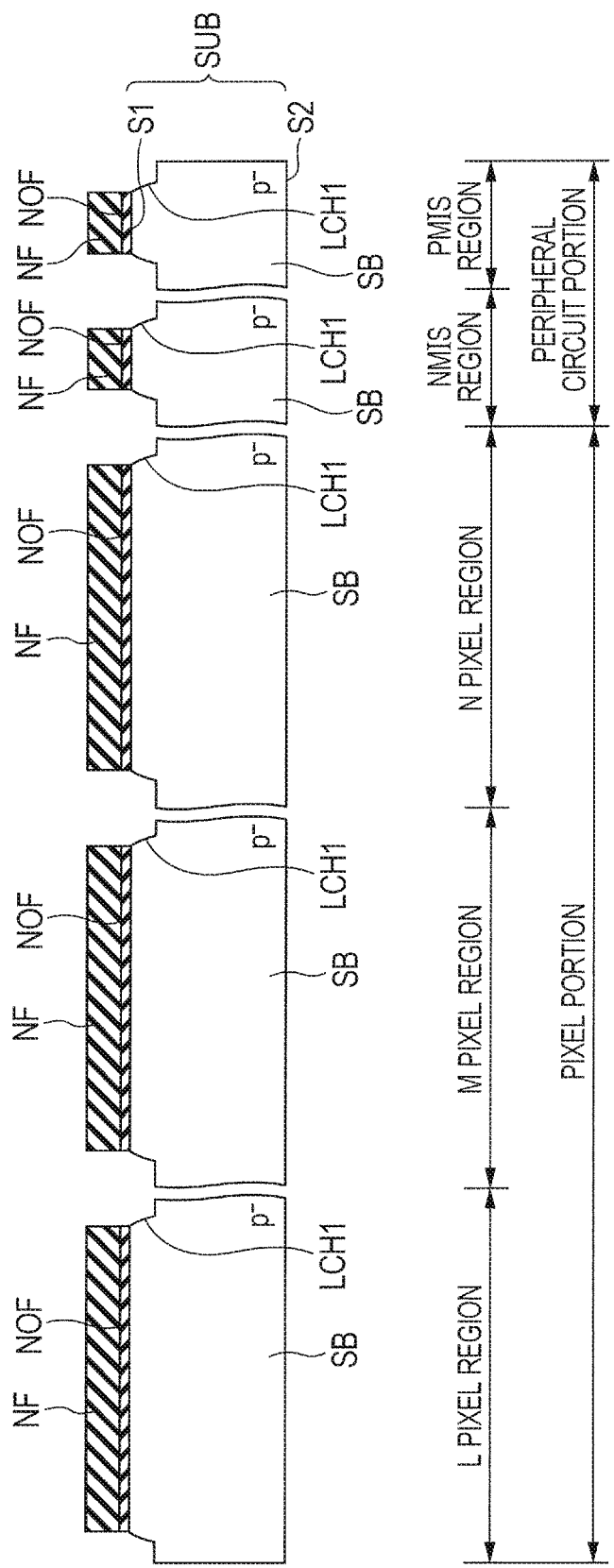
FIG. 29 is a schematic cross-sectional view showing a first step of a manufacturing method of the semiconductor device of Second Embodiment.

As FIG. 29 shows, in a manufacturing method of the present embodiment, for example, a silicon oxynitride film NOF is formed by CVD or the like instead of the silicon oxide film OX formed on a substantial entirety of the main surface S1 of the semiconductor substrate SUB in the step of FIG. 5 and a recess LCH1 having a smaller depth in the perpendicular direction in the drawing than the trench TCH1 is formed instead of the trench TCH1. The step of FIG. 29 is different from that of FIG. 5 in the above-mentioned point, but it is basically similar to the step of FIG. 5 in another point so that details on a point common to FIG. 5 are omitted.

Figure 30:
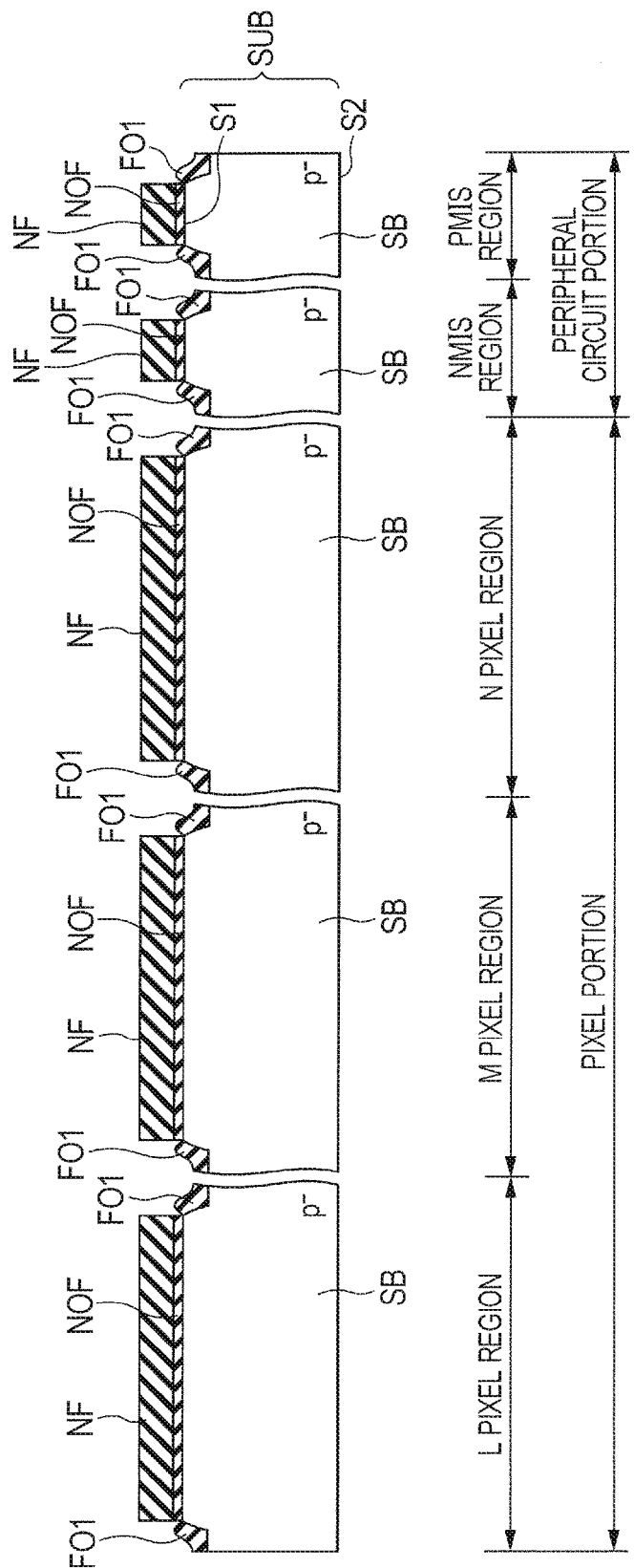
FIG. 30 is a schematic cross-sectional view showing a second step of the manufacturing method of the semiconductor device of Second Embodiment.

As FIG. 30 shows, a field oxide film FO1 made of a silicon oxide film is formed, for example, by subjecting a bottom-side wall portion (bottom and lateral portions of the inner wall) of the recess LCH1 to thermal oxidation treatment. More specifically, silicon of the bottom-side wall portion of the recess LCH1 is oxidized by thermal oxidation treatment to fill the recess LCH1 with the field oxide film FO1 made of a silicon oxide film. Although not illustrated here, a photoresist may be applied to the upper surface of the silicon nitride film NF.

Figure 31:
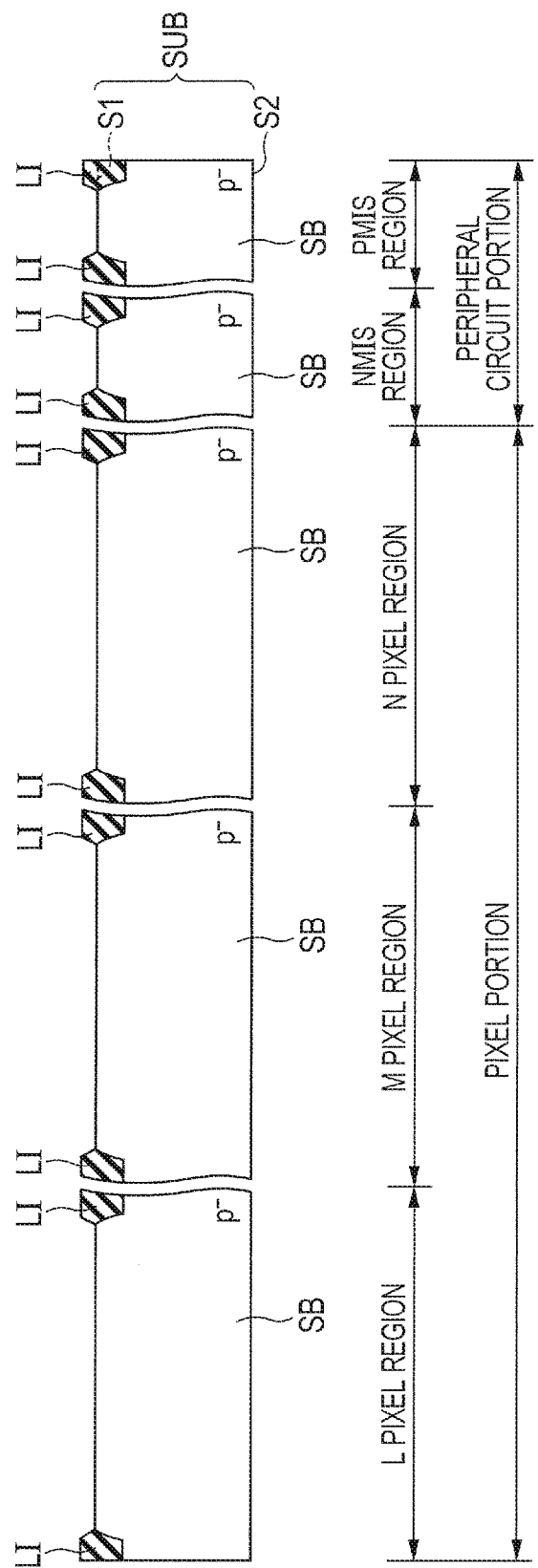
FIG. 31 is a schematic cross-sectional view showing a third step of the manufacturing method of the semiconductor device of Second Embodiment.

As FIG. 31 shows, the silicon nitride film NF and the silicon oxynitride film NOF are then removed by etching to expand the uppermost surface of the field oxide film FO1 above and below the main surface S1 of the semiconductor substrate SUB. Such a technology of locally forming an oxide film by thermal oxidation treatment is called "LOCOS" and by this technology, an element isolation insulating film LI is formed. The element isolation insulating film SI has, at a perpendicularly center portion thereof (a portion placed at a perpendicular height almost equal to that of the main surface S1), preferably a cross-sectional shape wider in the horizontal width than that in another region (upper side and lower side regions).

Steps after that are similar to those shown in FIGS. 8 to 25 in First Embodiment.

Third Embodiment

Figure 32:
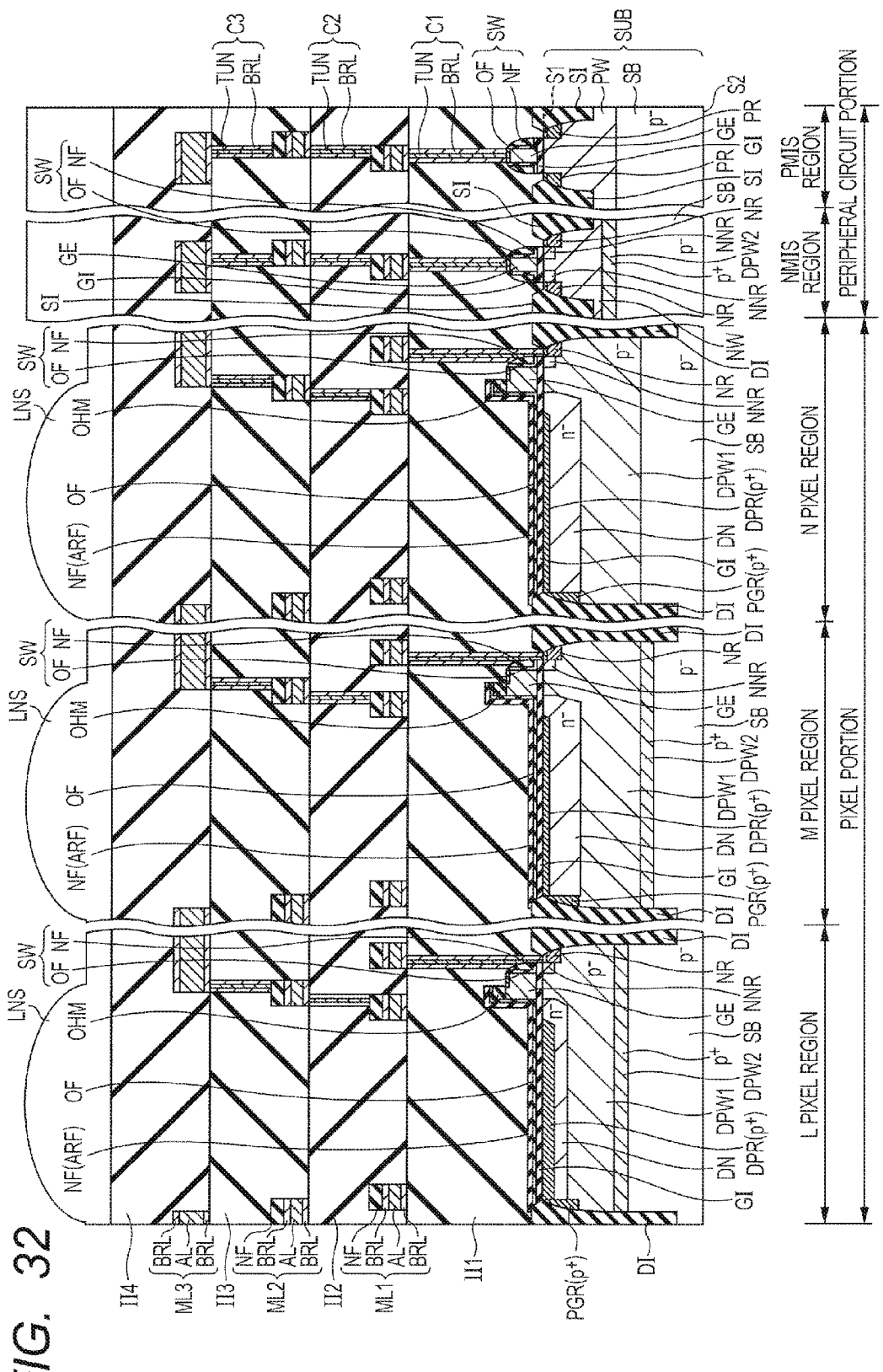
FIG. 32 is a schematic cross-sectional view showing the configuration of a semiconductor device of Third Embodiment in the region A encircled with the dotted line in FIG. 2.

As FIG. 32 shows, the present embodiment has, instead of the element isolation insulating film SI formed by STI in First Embodiment, an element isolation insulating film DI which is called a DTI (deep trench isolation) film, extends on the side of the main surface S2 more deeply than the element isolation insulating film SI, and is made of, for example, a silicon oxide film.

The element isolation insulating film DI is, similar to the element isolation insulating film SI, formed preferably at a boundary portion between one pixel region and another pixel region adjacent thereto. For example, it may be formed in the main surface S1 in at least a portion of a region overlapping, in plan view, with the p-type well DPW3 located in the pixel boundary region. The element isolation insulating film DI preferably extends to the side of the main surface S2 deeper than the lowermost portion, most distant from the main surface S1, of the p type well region DPW1 of the pixel region (adjacent to the element isolation insulating film). The element isolation insulating film DI preferably has, compared with a region nearest to the main surface S1, a cross-sectional shape having a horizontally narrower width in a region below the most nearest region (in a region on the side of the main surface S2).

Figure 33:
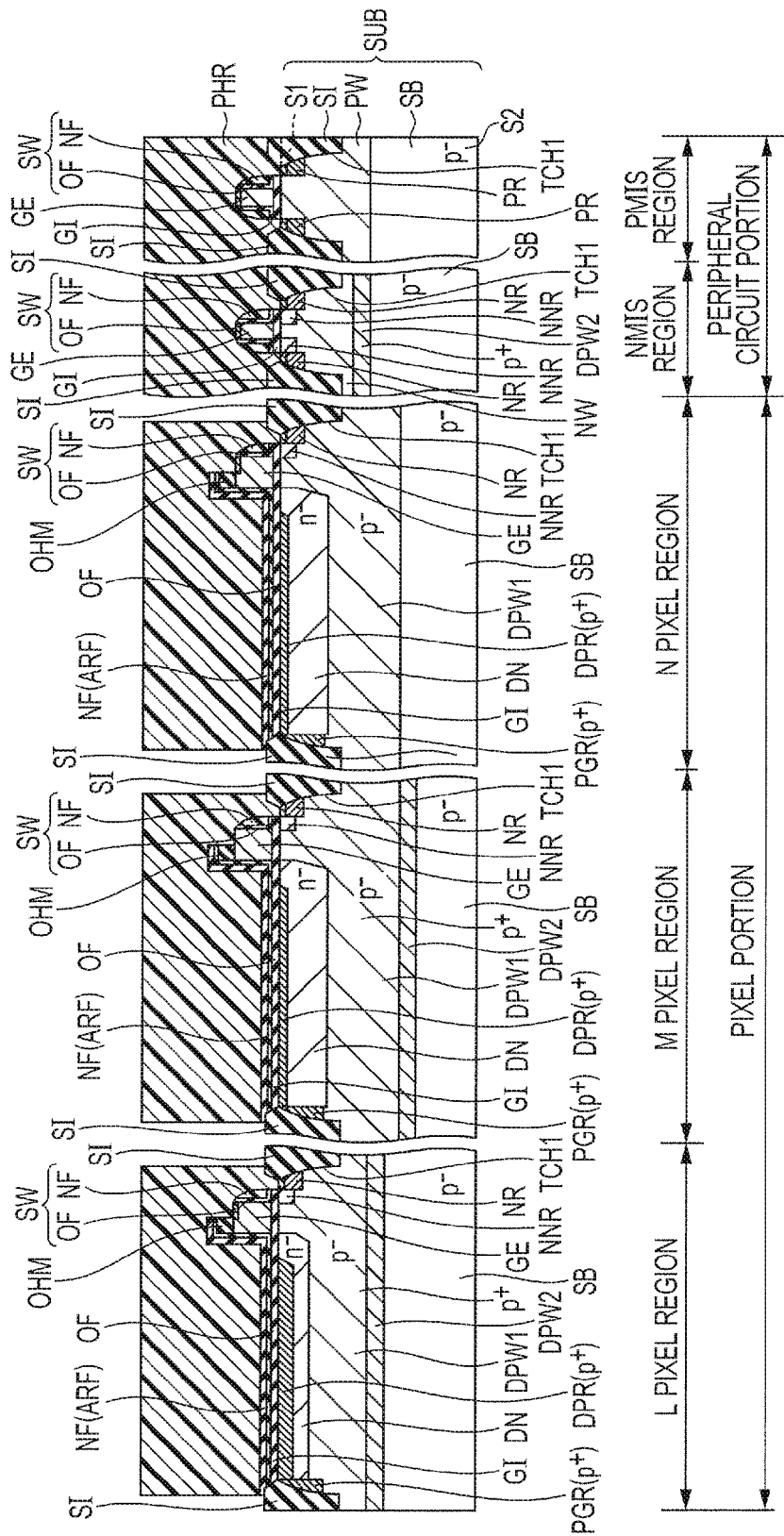
FIG. 33 is a schematic cross-sectional view showing a first step of a manufacturing method of the semiconductor device of Third Embodiment.

As FIG. 33 shows, in the present embodiment, a trench TCH1 having a width similar to that of the trench TCH1, which is formed in order to form the element isolation insulating film SI in First Embodiment, is formed and then a gate electrode GE, a silicon oxide film OF, a silicon nitride film NF, and the like are formed on the trench (on the main surface of the semiconductor substrate SUB).

Figure 34:
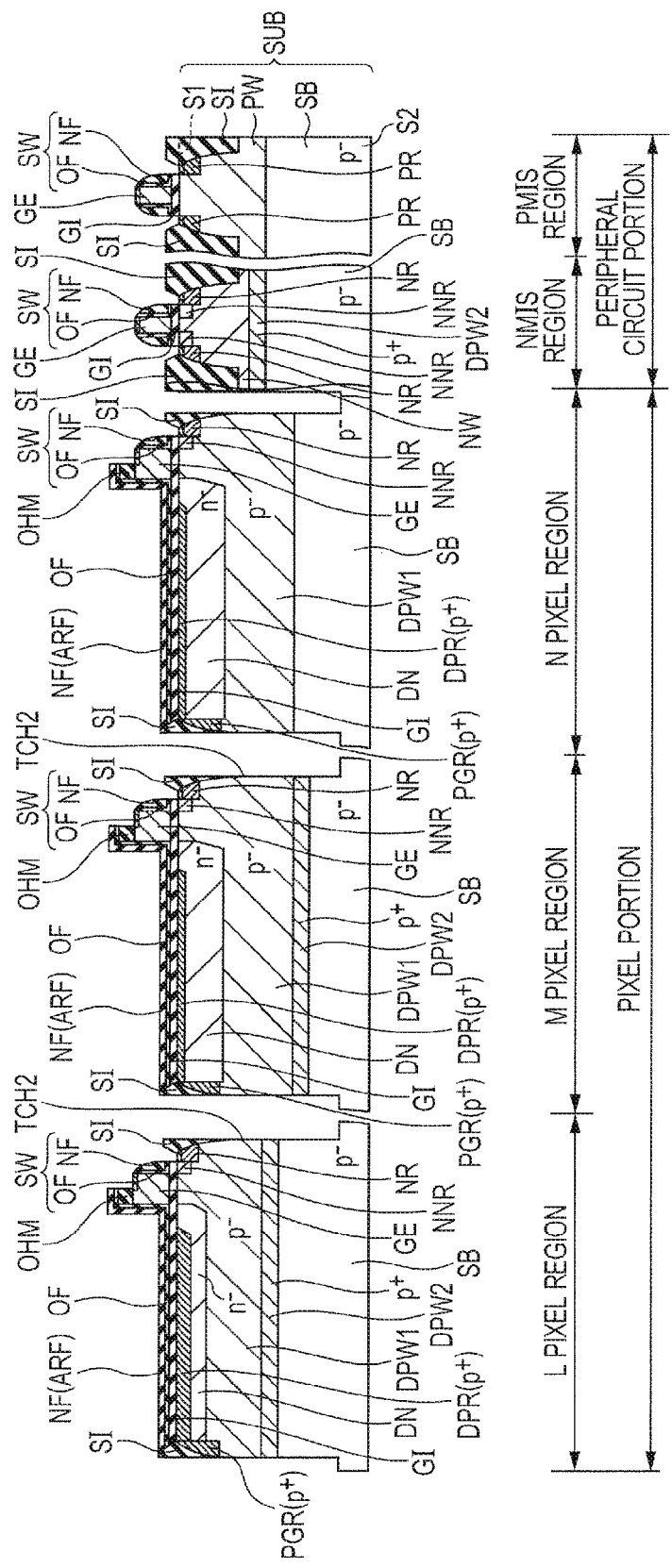
FIG. 34 is a schematic cross-sectional view showing a second step of the manufacturing method of the semiconductor device of Third Embodiment.

As FIG. 34 shows, a trench TCH2 extending more deeply to the side of the main surface S2 than the trench TCH1 is formed by typical photolithography and etching. This trench TCH2 preferably extends more deeply to the side of the main surface S2 (deep region) than the lowermost portion, most distant from the main surface S1, of the p type well region DPW1 of the pixel region (adjacent to the trench).

As in the present embodiment, using the element isolation insulating film DI extending more deeply to the side of the main surface S2 than the element isolation insulating film SI or LI can enhance an effect of inhibiting charges from transferring from the pixel region having therein the element isolation insulating film DI to a pixel region adjacent thereto. This makes it possible to allow pixels which should collect charges to collect them more surely and improve the image quality.

The element isolation insulating film DI containing, for example, a p type impurity may be used.

Fourth Embodiment

The semiconductor device according to each of the above-mentioned embodiments has a pixel portion that includes the above-mentioned L, M, and N pixel regions, performs photoelectric conversion, and outputs the charges thus collected and an image processing section that calculates the signal value of the charges output from the pixel portion and thereby outputting the signal value from the L, M, and N pixel regions.

As shown in the graph of FIGS. 26 and 27, the image processing section detects, as a signal due to a short wavelength visible light such as blue light, a signal value obtained from the L pixel region; detects, as a signal due to a middle wavelength visible light such as green light, a difference obtained by subtracting the signal value obtained from the L pixel region from a signal value obtained from the M pixel region; and detects, as a signal due to a long-wavelength light such as red light, a difference obtained by subtracting the signal value obtained from the M pixel signal from a signal value obtained from the N pixel region.

Figure 35:
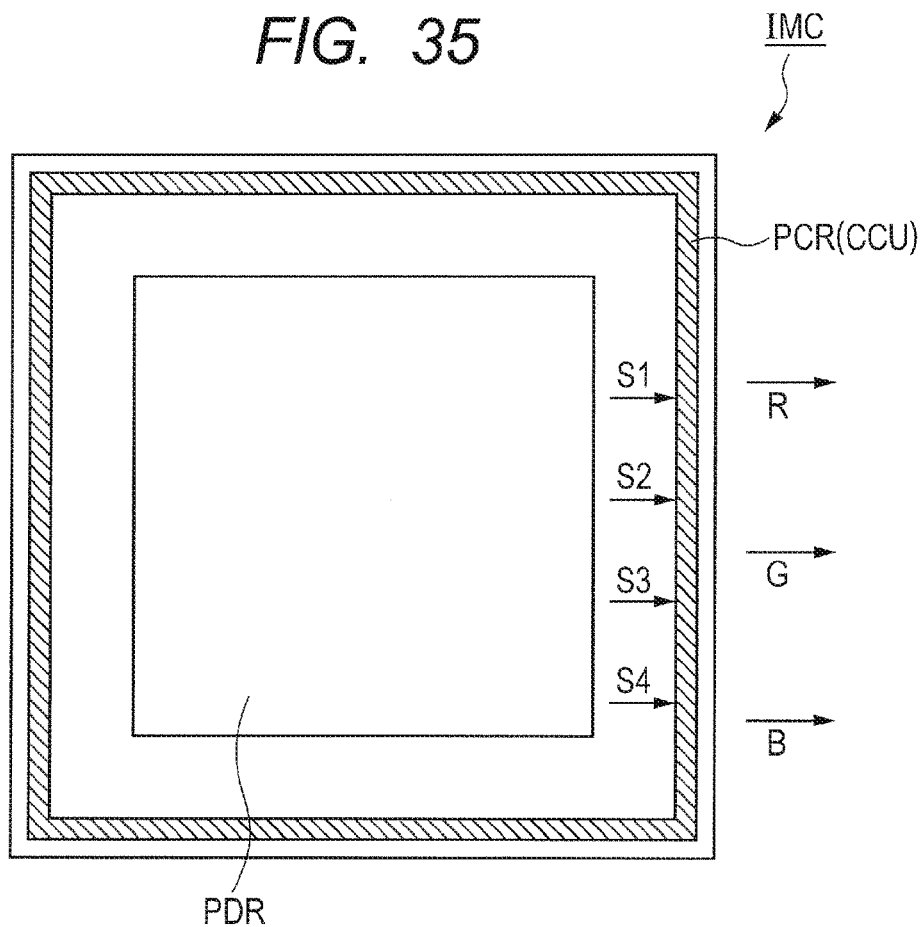
FIG. 35 is a schematic cross-sectional view showing the configuration of a semiconductor device of a first example of Fourth Embodiment.

More specifically, as FIG. 35 shows, data S1, S2, S3, and S4 of an image from each pixel region of the pixel portion PDR are transmitted to the image processing section CCU. In the drawing, S1 represents a signal of charges from the L pixel, S2 represents a signal of charges from the M pixel, S3 represents a signal of charges from the N pixel, and S4 represents a signal such as IR signal obtained by applying a specific gravity to a signal of charges from each pixel.

The signals S1 to S4 are input into the image processing section CCU and then subjected to arithmetic processing (subtraction) at the image processing section CCU. The results are output as signal values R, G, and B of respective colors from the image processing section CCU.

Figure 36:
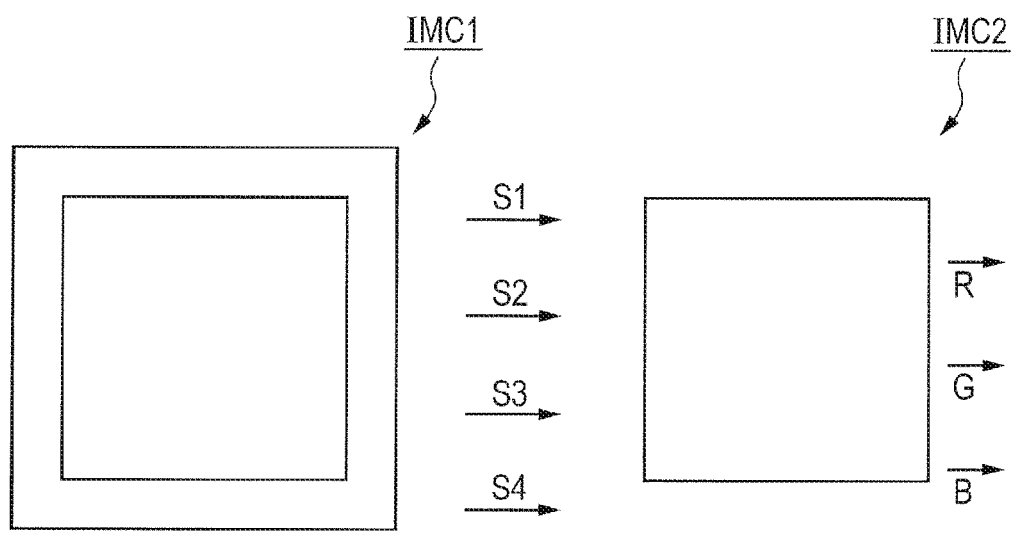
FIG. 36 is a schematic cross-sectional view showing the configuration of a semiconductor device of a second example of Fourth Embodiment.

The image processing section CCU may be formed, for example, in (the semiconductor substrate SUB (refer to FIG. 4) of) the chip region IMC of the semiconductor chip having the pixel portion PDR therein as shown in FIG. 35. In this case, the image processing section CCU is placed, for example, in the peripheral circuit portion PCR of the chip region IMC. Alternatively, the image processing section CCU may be formed, for example as shown in FIG. 36, in a chip region IMC2 as a semiconductor substrate other than (the semiconductor substrate SUB (refer to FIG. 4) of) a chip region IMC1 of the semiconductor chip having the pixel portion PDR therein. In this case, the data S1, S2, S3, and S4 of an image output from the chip region IMC1 are input in the chip region IMC2 and after arithmetic processing in the chip region IMC2, the results are output as signal values R, G, and B of respective colors from the image processing section CCU.

The invention made by the present inventors has been described specifically based on embodiments. It is, however, needless to say that the invention is not limited to the above-described embodiments and various changes may be made thereto without departing from the gist of the invention.

What is claimed is:

1. A semiconductor device comprising:
   a p type semiconductor substrate having a main surface; and
   first, second, and third pixel regions arrayed to each other, in plan view, in the p type semiconductor substrate;
   wherein the first, second, and third pixel regions respectively comprise:
   first through third p type well regions formed in the p type semiconductor substrate;
   first through third n type regions formed in the first through third p type well regions and configuring first through third pn junctions with the first through third p type well regions, respectively,
   wherein the first p type well region of the first pixel region has a distance, from the main surface to the lowermost portion most distant therefrom, shorter than those of the second and third p type well regions of the second and third pixel regions,
   wherein on the side opposite to the main surface of the first and second p type well regions of the first and second pixel regions, first and second buried p type well regions are respectively placed further away from the main surface than the first and second p type well regions so as to be contiguous to the first and second p type well regions respectively, and
   wherein the first through third n type regions are disposed between the main surface and the first through third p type well regions, respectively.

2. The semiconductor device according to claim 1, further comprising:
   a peripheral p-type well located in a pixel boundary region in a region between two of the first to third pixel regions in plan view.

3. The semiconductor device according to claim 1,
   wherein the first, second, and third pixel regions further comprises first through third p type regions formed in the first through third n type regions, respectively, and
   wherein the first p type region of the first pixel region has a distance, from the main surface to the lowermost portion most distant therefrom, longer than any of the second and third p type regions in the second and third pixel regions.

4. The semiconductor device according to claim 1,
   wherein the first n type region of the first pixel region has a distance, from the main surface to the lowermost portion most distant therefrom, shorter than any of the second and third n type regions in the second and third pixel regions.

5. The semiconductor device according to claim 2,
   wherein an element isolation insulating film lies in the main surface in at least a portion of a region overlapping, in plan view, with the peripheral p-type well located in the pixel boundary region, and
   wherein the element isolation insulating film extends to a region deeper than the lowermost portion of any of the first through third p type well regions.

6. The semiconductor device according to claim 1, comprising:
   a pixel portion including the first, second, and third pixel regions; and
   an image processing section that performs arithmetic processing of a signal from the pixel portion,
   wherein the image processing section:
   detects, as a signal due to a short wavelength visible light, a signal value obtained from the first pixel region;
   detects, as a signal due to a middle wavelength visible light, a difference obtained by subtracting the signal value obtained from the first pixel region from a signal value obtained from the second pixel region; and
   detects, as a signal due to a long-wavelength light, a difference obtained by subtracting the signal value obtained from the second pixel region from a signal value obtained from the third pixel region.

7. The semiconductor device according to claim 6,
   wherein the image processing section is formed in the p type semiconductor substrate.

8. The semiconductor device according to claim 6,
   wherein the image processing section is formed in a semiconductor substrate different from the p type semiconductor substrate.

9. The semiconductor device according to claim 1, further comprising:
   first through third lens disposed on the first, second, and third pixel regions respectively.

* * * * *